(12) United States Patent  
Chow

(10) Patent No.: US 8,553,482 B2  
(45) Date of Patent: Oct. 8, 2013

(54) SENSE AMPLIFIER AND SENSE AMPLIFIER LATCH HAVING COMMON CONTROL

(75) Inventor: Daniel C. Chow, Austin, TX (US)

(73) Assignee: Apple Inc., Cupertino, CA (US)

( * ) Notice: Subject to any disclaimer, the term of this patent is extended or adjusted under 35 U.S.C. 154(b) by 207 days.

(21) Appl. No.: 13/212,490

(22) Filed: Aug. 18, 2011

(65) Prior Publication Data

US 2012/0134226 A1    May 31, 2012

Related U.S. Application Data

(60) Provisional application No. 61/417,554, filed on Nov. 29, 2010.

(51) Int. Cl.
*G11C 7/00* (2006.01)

(52) U.S. Cl.
USPC ..................... 365/205; 365/189.02

(58) Field of Classification Search
USPC ........................... 365/189.02, 205
See application file for complete search history.

(56) References Cited

U.S. PATENT DOCUMENTS

| | | | |
|---|---|---|---|
| 5,563,835 A * | 10/1996 | Oldham | ........................ 365/207 |
| 5,923,601 A | 7/1999 | Wendell | |
| 6,163,498 A | 12/2000 | Moon | |
| 6,518,798 B2 | 2/2003 | Telecco | |
| 6,580,648 B1 | 6/2003 | Barnes | |
| 6,961,276 B2 | 11/2005 | Atallah | |
| 7,391,656 B2 | 6/2008 | Wang | |
| 7,411,839 B2 | 8/2008 | Cha | |
| 7,619,923 B2 | 11/2009 | Correale | |
| 7,869,293 B2 | 1/2011 | Morein | |
| 2006/0092716 A1 * | 5/2006 | Nam et al. | ............... 365/189.05 |
| 2008/0008011 A1 * | 1/2008 | Moon et al. | ............. 365/189.02 |
| 2008/0231336 A1 | 9/2008 | Wu | |
| 2013/0080847 A1 | 3/2013 | Zorian et al. | |

OTHER PUBLICATIONS

U.S. Appl. No. 13/212,450, entitled "Sense Amplifier Latch With Integrated Test Data Multiplexer," filed Aug. 18, 2011.

* cited by examiner

*Primary Examiner* — Hoai V Ho
(74) *Attorney, Agent, or Firm* — Anthony M. Petro; Meyertons, Hood, Kivlin, Kowert & Goetzel, P.C.

(57) ABSTRACT

A sense amplifier of a memory array may be provided to amplify data presented from storage cells of the memory array. Additionally, a sense amplifier latch may be provided to store data received from the sense amplifier. The sense amplifier may be enabled for operation by a sense amplifier enable signal that is distinct from a clock signal. Moreover, the latch enable signal of the sense amplifier latch may be controlled by the sense amplifier enable signal, such that the sense amplifier latch opens in response to activation of the sense amplifier and closes in response to deactivation of the sense amplifier.

19 Claims, 14 Drawing Sheets

US 8,553,482 B2

SENSE AMPLIFIER AND SENSE AMPLIFIER LATCH HAVING COMMON CONTROL

PRIORITY CLAIM

This application claims benefit of priority of U.S. Provisional Appl. No. 61/417,554, filed Nov. 29, 2010, which is hereby incorporated by reference in its entirety.

BACKGROUND

1. Technical Field

This invention is related to the field of processor implementation, and more particularly to techniques for implementing memory arrays.

2. Description of the Related Art

Processors, and other types of integrated circuits, typically include a number of memory arrays for data storage. For example, memory arrays may be employed to implement caches, register files, queues, buffers, or other types of structures in which data needs to be stored in a dense and organized fashion.

Memory array design may be a significant factor in the overall design area required to implement an integrated circuit, as well as its operating frequency and power consumption. Mobile processor applications may be particularly sensitive to power consumption issues, in that power consumption is ordinarily directly related to battery life. Improving the power efficiency of memory arrays may improve a processor's overall power consumption.

SUMMARY

In various embodiments, a sense amplifier of a memory array may be provided to amplify data presented from storage cells of the memory array. Additionally, a sense amplifier latch may be provided to store data received from the sense amplifier. For example, the latch may open in response to assertion of a latch enable signal to receive data, and close in response to deassertion of the latch enable signal to capture and store the received data.

The sense amplifier may be enabled for operation by a sense amplifier enable signal that is distinct from a clock signal. Moreover, the latch enable signal of the sense amplifier latch may be controlled by the sense amplifier enable signal, such that the sense amplifier latch opens in response to activation of the sense amplifier and closes in response to deactivation of the sense amplifier. Additionally, in some implementations, the sense amplifier enable signal may be generated such that its assertion is frequency dependent and its deassertion is self-timed.

BRIEF DESCRIPTION OF THE DRAWINGS

The following detailed description makes reference to the accompanying drawings, which are now briefly described.

Figure 1:
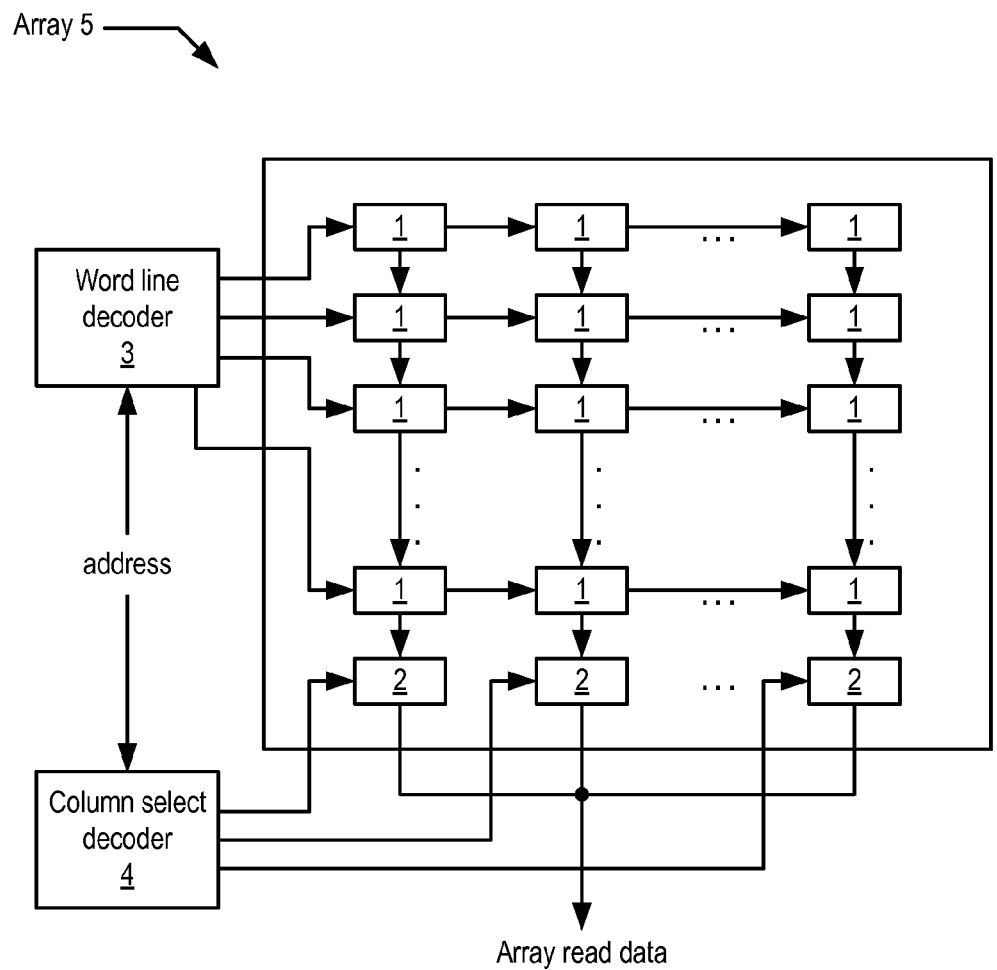
FIG. 1 illustrates a general example of organization of a memory array.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

Memory Array Components

Microprocessors and other types of integrated circuits typically include a number of memory arrays that may be used to store various types of information. For example, memory arrays may be included within caches, such as instruction caches, data caches, or hybrid caches. Memory arrays may also be used to implement register files, content-addressable memories, buffers, or any other suitable type of data structure in which relatively dense data storage is desired.

Typically, memory arrays may be arranged as a collection of rows and columns (and possibly banks, sub-banks, and/or other levels of hierarchy). Data storage elements typically may be located at the intersections of the rows and columns, although any suitable architecture may be employed. The data storage elements may be selected by decoding an address or other input that indexes the data elements. For example, one portion of a memory address may be decoded to select a row within the memory array, while a different portion may be decoded to select one or more banks, columns, or other units of data storage.

FIG. 1 illustrates a general example of how an embodiment of a memory array might be organized. In the illustrated embodiment, array 5 includes a number of data storage elements 1 arranged into rows and columns. Each of the data storage elements 1 within a particular row is coupled to a word line respectively corresponding to that row and generated by a word line decoder 3. Array 5 further includes a number of output drivers 2, including a respective output driver 2 for each column. In the illustrated embodiment, each of the data storage elements 1 within a particular column is coupled to drive an output driver 2. In some embodiments, for each column, array 5 may include one or more respective bit lines through which storage elements 1 may be coupled to drive output driver 2, and storage elements 1 within a given column may be coupled to the one or more respective bit lines corresponding to the given column. Each output driver 2 is controlled by a corresponding column select signal generated by a column select decoder 4.

In some embodiments, data storage elements 1 may be implemented using cross-coupled inverters or other suitable types of storage circuits. When enabled for reading (e.g., by activation of a corresponding word line) data storage elements 1 may be operable to produce a small-signal differential output indicative of the value they store. For example, a given data storage element 1 may produce an output that is differentially encoded on a pair of wires, also referred to as bit lines, that represent a true and complement version of the data stored in the given data storage element 1. However, when evaluating, the voltage differential between the bit lines may be smaller than the difference between voltage levels that are ordinarily used to distinguish a logic 1 from a logic 0. For example, the voltage differential on the bit lines may be in the range of hundreds of millivolts, whereas the difference between a true logic 1 and a true logic 0 may be on the order of one or several volts. In some such embodiments, output driver 2 may be implemented as a sense amplifier that is configured to amplify the small-signal differential output of data storage elements 1 in order to generate a full-signal logic 1 or 0 corresponding to the stored value.

By decoding different portions of an input address, word line decoder 3 may select a particular row to be read, while column select decoder 4 may select a particular column to be output from within the selected row. However, it is noted that the illustrated configuration is merely one possible arrangement. Numerous other variations on array organization are possible and contemplated that may use banks or other hierarchical divisions in addition to or in place of rows and columns.

Figure 2:
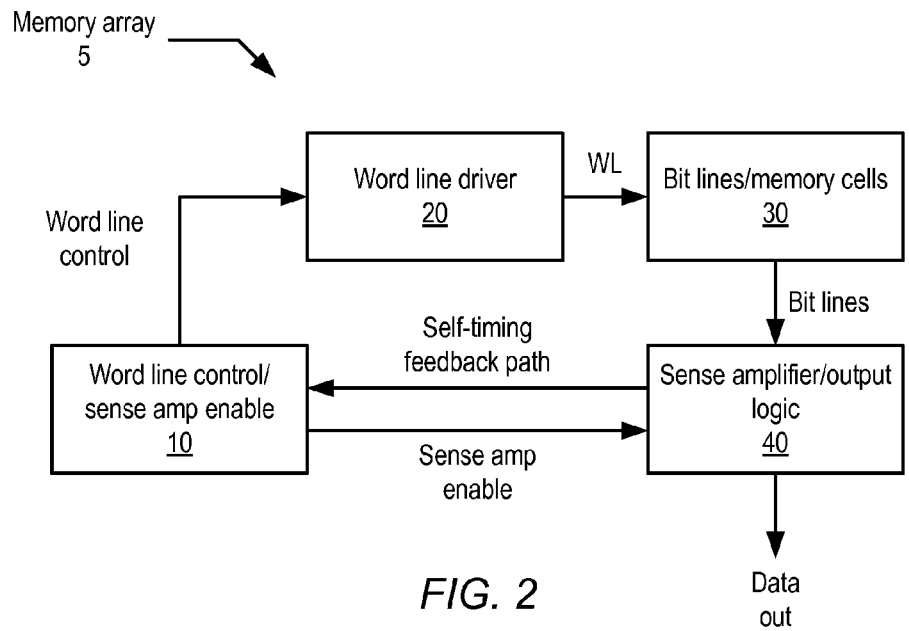
FIG. 2 is a block diagram illustrating selected circuits of an embodiment of a memory array.

Turning now to FIG. 2, a block diagram of an embodiment of a memory array is shown in which aspects of the word line driver organization are illustrated in greater detail. In the illustrated embodiment, memory array 5 may include a word line control/sense amplifier enable unit 10 that is coupled to a word line driver unit 20 and a sense amplifier/output logic unit 40. Word line driver unit 20 may be coupled to bit lines/memory cells 30, which are in turn coupled to sense amplifier/output logic unit 40. It is noted that the configuration shown is merely one example. In various embodiments, memory array 5 may include additional or alternative elements. For example, memory array 5 may include additional units such as decoders, clock generators, multiplexers, test logic, or any other suitable functionality. Also, it is contemplated that memory array 5 may be employed in any suitable memory array application. For example, it may be used within a cache or other functional unit of a microprocessor, or any other suitable type of integrated circuit.

Figure 3:
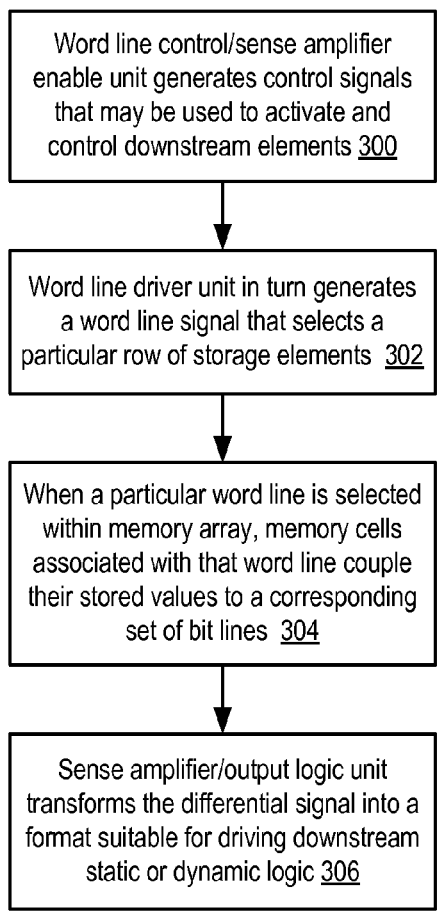
FIG. 3 illustrates an example of a method of operation of a memory array.

Generally speaking, the architecture of memory array 5 shown in FIG. 2 may operate as shown in FIG. 3. Referring collectively to FIGS. 2 and 3, operation may begin in block 300 where word line control/sense amplifier enable unit 10 may generate control signals that may be used to activate and control downstream elements. For example, the word line control signal may control word line driver unit 20 by enabling and disabling word line driver unit 20 at appropriate times during array access. Word line driver unit 20 in turn may generate a word line signal that selects a particular row of storage elements (block 302). For example, word line driver unit 20 may decode a portion of a memory address to generate the word line, as mentioned above.

When a particular word line is selected within memory array 5, the memory cells associated with that word line may couple their stored values to a corresponding set of bit lines (e.g., in the case of an array read operation) (block 304). In some embodiments, bit lines/memory cells 30 may produce a small signal, differential output, in which the stored value is represented by a pair of bit lines that encode a true and complement form of the stored value. Because the voltage difference between the true and complement bit lines may be small, sense amplifier/output logic unit 40 may be employed to transform the differential signal into a format suitable for driving downstream static or dynamic logic (block 306).

Frequency-dependent, Self-timed Word Line Kill and Sense Amp Enable

During ordinary operation of a memory array circuit like the embodiment of FIG. 2, relatively early during the array access, a word line may be decoded and used to select a particular row of storage cells to be accessed. For example, as mentioned above, index bits of a memory address may be decoded to select one of a number of word lines. Once a particular word line has been asserted, the values of storage cells corresponding to the particular word line may be coupled to their respective bit lines, and the sense amplifier may be enabled to capture these values.

In a conventional implementation, once a word line is asserted early in a given array access operation, it may remain active (and consuming power) during the remainder of the access operation. For example, if the word line is decoded and asserted shortly after the beginning of a clock cycle, it may remain asserted through at least a phase of the clock cycle, or possibly the entire clock cycle until the next decode begins. However, during a given array access operation, once the sense amplifier has sensed the bit lines, it may no longer be necessary to drive the word line during that particular access operation. By disabling the word line once sensing has occurred, array power consumption may be reduced relative to a configuration in which the word line remained active late into a cycle.

It may also be the case that configuring word line and sense amplifier enable logic to remain asserted until being reset by a clock-triggered event (e.g., by the rising or falling edge of a clock, or by new data or control signals launched by a clock edge) may make it more difficult to design a memory array that is capable of operating at a variety of different frequencies. For example, hold time issues may result from attempting to run clock-triggered logic at slower than typical clock speeds, as may be the case during testing or in other modes of operation. By contrast, designing these signals to reset themselves on the basis of self-timed logic may render them more robust to operation at different frequencies, in addition to reducing power consumption.

Figure 4:
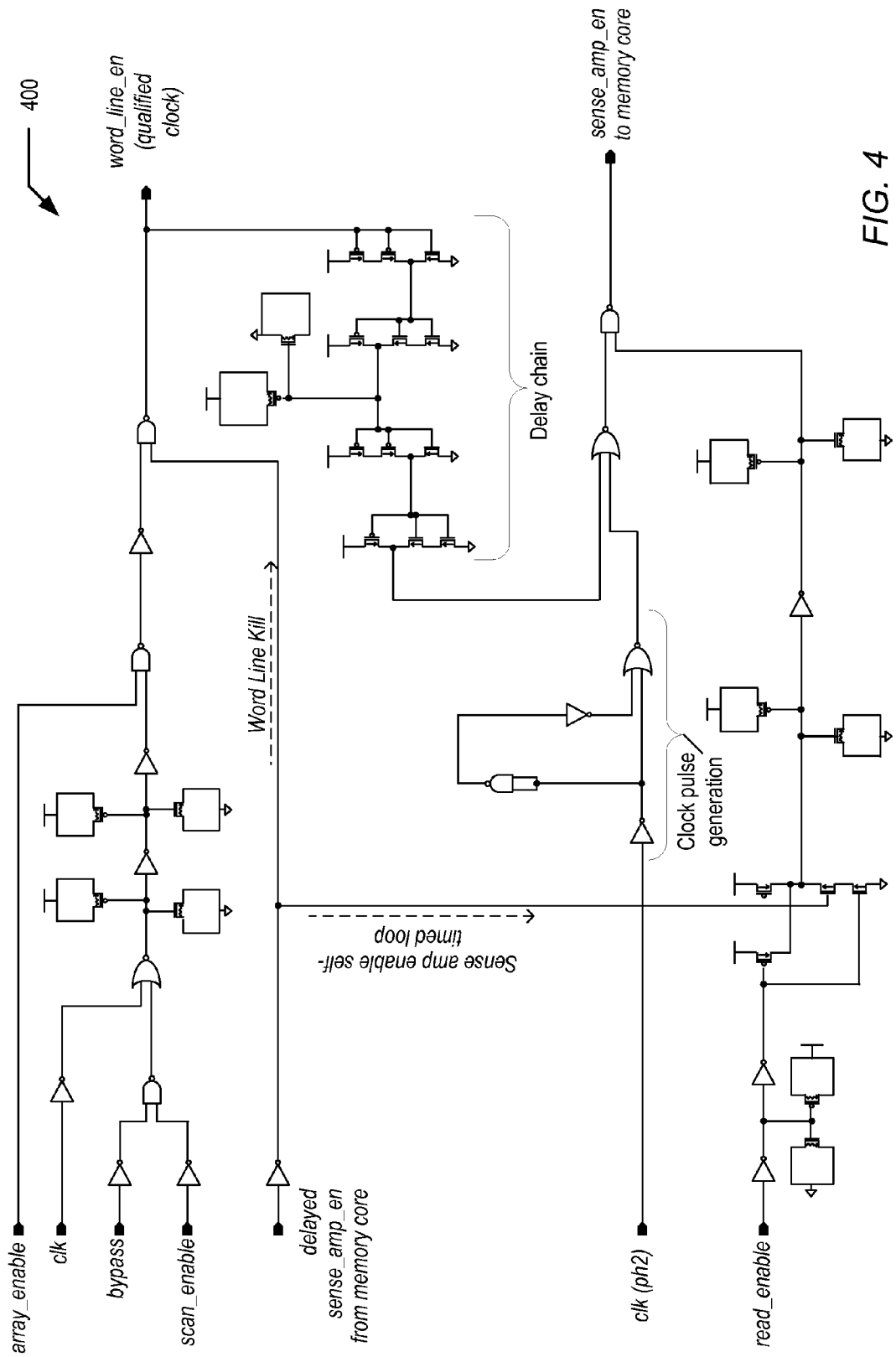
FIG. 4 illustrates an embodiment of a word line control/sense amp enable unit that may be configured to generate a frequency-dependent, self-timed sense amplifier enable signal as well as a frequency-dependent, self-timed word line control signal.

FIG. 4 illustrates an embodiment of word line control/sense amp enable unit 10, here denoted circuit 400, that may be configured to generate a frequency-dependent, self-timed sense amplifier enable signal as well as a frequency-dependent, self-timed word line control signal. In the illustrated embodiment, circuit 400 includes the following primary inputs: array_enable, clk (dual phase), bypass, scan_enable, and read_enable. In some embodiments, the bypass and scan_enable inputs may control testability features that may be active only during a test mode of operation; these inputs may be quiescent during normal (i.e., non-testing) circuit operation.

The array_enable input may represent an enable at any suitable level of granularity within the memory array. For example, it may represent a global enable signal that is generic to an entire array, or it may be one of a number of discrete enable signals that are specific to respective banks, sub-arrays, or other subdivisions of the memory array. In some embodiments, the array_enable input may be determined from a combination of inputs, such as a decoded portion of a memory address (e.g., in order to select a particular bank, set, or other array subdivision), one or more control inputs (e.g., being indicative of an active memory array access operation, such as a control signal decoded from a load or store instruction or other operation involving memory access), and/or other specified inputs.

In some embodiments, the read_enable input may be generated in a similar fashion to the array_enable input, with the additional qualification that the read_enable input specifically indicates that the current memory access operation is a read operation (as opposed to a write operation). In some embodiments, the read_enable input may reflect a similar level of array granularity as the array_enable input, while in other embodiments, the read_enable input may correspond to a different level of granularity. For example, the read_enable input may be a global input with respect to an entire memory array, whereas the array_enable input may be specific to a particular array subdivision, or vice versa.

In the illustrated embodiment, two different clock phases may be employed. In general, when one of the two clock phases is asserted, the other may be deasserted, though in various embodiments the phases may be partially overlapping or entirely non-overlapping. Also, in other embodiments, more or fewer clock phases may be used. In some embodiments, the clock signals may be conditionally generated. For example, a clock generator circuit may be controlled by a logic signal such that a clock is only generated under certain conditions (e.g., when a memory access operation is occurring). Such control may occur in addition to or instead of qualifying a clock with downstream logic.

It is noted that in FIG. 4, as well as all of the other figures shown, the specific logical sense of any given signal may be either positive or negative in various embodiments. That is, a positive-sense signal may be considered to be asserted when driving a high voltage and deasserted when driving a low voltage, whereas a negative-sense signal may be asserted when low and deasserted when high. In general, the sense of a signal may be inverted simply by using a logical inverter circuit. Because inverters are commonly used to amplify signal strength prior to driving a signal for long distances, and/or at the destination of a signal that has been driven for some distance, they may commonly be added at the boundaries of circuits in order to meet timing requirements. Depending on the nature of the source or destination circuit, an even number of inverters may be added to a path, which would not affect the logic of the source or destination circuit. Alternatively, an odd number of inverters may be added to a path, which may necessitate complementation of the logic at either the source or the destination circuit.

It is contemplated that the specific logical sense of the signals shown in the figures may vary in various embodiments, as may the specific arrangement of gates employed. In an effort to simplify explication of the overall functional architecture of the illustrated circuits, the general function of the signals and circuit elements is described without reference to the specific logical sense of any particular signal. Depending on the specific implementation used, it is understood that variations of the illustrated circuits may be obtained by adding or deleting inversions or rearranging Boolean circuit elements, and it is contemplated that such variations are encompassed by the description and claims.

In the embodiment of circuit 400 shown in FIG. 4, the input clock signal is combined with the bypass and scan_enable signals and delayed through several inverters. (The gates of tied-off P and N devices add additional capacitive loading to the path, further delaying the signal.) The resulting delayed clock signal is qualified with the array_enable signal as well as a delayed version of the sense amplifier signal (discussed below) to produce the word line enable signal denoted "word_line_en." The word line enable signal may be routed to other units, as discussed in greater detail below. In some embodiments, it may be employed to control generation of a word line signal, such that if the word line enable is not asserted, the word line signal is also not asserted. (For example, the word line enable signal may be supplied as a control input to a word line decoder circuit, or as a control input to the clocking circuitry of a word line decoder, in order to force the decoder output to a deasserted state if the enable is not active.) In some embodiments, the word line enable signal may have other applications as well. For example, it may be employed to control precharging of the bit lines and/or sense amplifiers within the memory array.

As with all other figures discussed herein, specific circuits may be shown as employing a particular arrangement of specific devices and/or gates. For example, the word_line_en path is shown to include a number of logical NAND gates. However, it is noted that such arrangements are merely examples. It is contemplated that in other embodiments, any logically-equivalent variant of an illustrated circuit may also be employed. For example, with appropriate transformations of the logical sense of input signals, any logical function may be implemented exclusively using NAND gates or NOR gates, or any suitable combination of these or other types of gates (e.g., invertors, XOR gates, XNOR gates, or gates implementing other logical functions).

In addition to being supplied to external circuitry, the word line enable signal generated by the embodiment of circuit 400 shown in FIG. 4 drives an internal delay chain, illustrated as a series of four inverters. (As shown, some of the inverters may include additional logically-redundant P or N devices that may be used to tune their timing behavior.) It is contemplated that the delay chain may be implemented by any suitable combination of devices. In some embodiments, the length of the delay chain may be programmable during manufacturing or runtime. For example, a metal mask option may be employed during manufacturing to couple additional delay elements (such as additional inverters) into the delay chain, or to remove elements from the delay chain. A software- or firmware-programmable control register may be supplied to accomplish a similar function during runtime (e.g., through the use of multiple different delay chains coupled to a multiplexer controlled by the control register).

After exiting the delay chain, in the illustrated embodiment, the word line enable is qualified with the opposite phase clock. That is, if clock phase 1 is used to generate the word line enable, clock phase 2 may be employed to qualify the delayed version of the word line enable, or vice versa. (In the illustrated embodiment, the opposite phase clock is combined with a delayed version of itself to generate a pulse that is shorter in duration than the clock itself, although this is not essential.) Generally, in a two-phase clock implementation, phase 2 rises as phase 1 falls. Thus, qualifying the delayed word line enable with the rising edge of phase 2 may be logically similar or equivalent to qualifying the delayed word line enable with the falling edge of phase 1, or vice versa.

After being qualified with the opposite phase clock, the word line enable is combined with the read_enable signal, which has been delayed and qualified with the delayed sense amplifier enable signal. The resulting signal is a sense amplifier enable signal, denoted "sense_amp_en," which may be routed to other units as described below.

It is noted that in the illustrated embodiment, the sense amplifier enable signal that is generated and sent to other logic is returned from the destination logic and fed back into unit 10 as the input "delayed sense_amp_en." This forms a feedback path that is used to disable both the word line enable and the sense amplifier enable signals after they have been asserted. That is, the sequence of events that leads to assertion of the word line enable and sense amplifier enable signals also causes these signals to be deasserted after a period of delay that depends in part on the round trip delay between unit 10 and the destination of the sense amplifier enable signal. Because the assertion of the sense amplifier enable causes its own deassertion without dependence on a clock signal, the deassertion of the sense amplifier enable and the word line enable may be referred to as being "self-timed." Generally speaking, the circuit elements that receive the sense amplifier enable signal and implement the feedback path may be referred to as a self-timed loop circuit.

It is additionally noted that the sense amplifier enable signal of FIG. 4 is distinct from a clock signal. Generally speaking, a clock signal is a periodic signal that has a predictable, cyclical behavior when it is enabled. By contrast, the sense amplifier enable signal is a control signal derived from other signals representing operating state of the circuit. Although a clock signal may be part of the logical function used to generate the sense amplifier enable signal, the state of the sense amplifier enable signal is not simply a function of time, as with a periodic clock signal, but also a function of other state variables.

Figure 5:
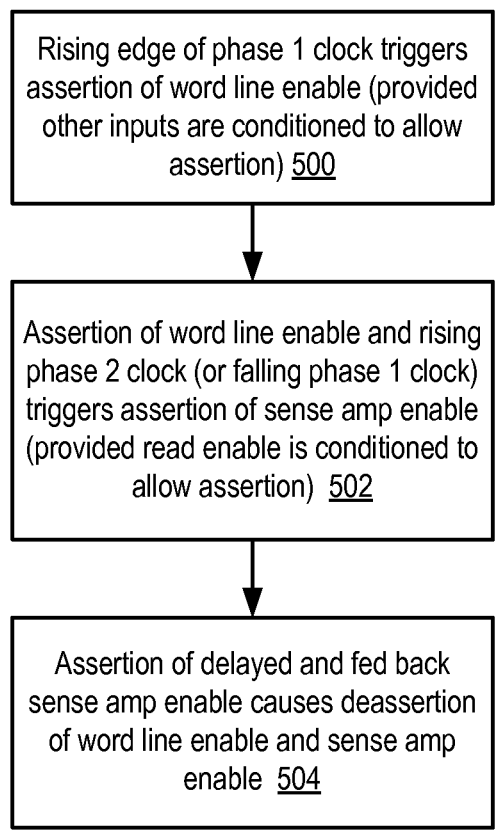
FIG. 5 illustrates an example of a method of operation of the circuit embodiment of FIG. 4.

FIG. 5 illustrates an example of the operation of the embodiment of circuit 400 shown in FIG. 4. In the illustrated embodiment, the rising edge of the phase 1 clock triggers assertion of the word line enable signal (provided that the other inputs are conditioned to allow this assertion) (block 500). After some delay, assertion of the word line enable signal combined with the rising edge of the phase 2 clock (or, equivalently, the falling edge of the phase 1 clock) causes the sense amplifier enable signal to be asserted (provided that the read_enable input is conditioned to allow this assertion) (block 502). Because assertion of both the word line enable and the sense amplifier enable signals is triggered dependent upon a clock edge, the assertion of these signals may be said to be "frequency dependent," in that the frequency with which they are asserted depends upon the frequency of the clock signal.

As noted above, the sense amplifier enable signal is delayed and fed back into the word line/sense amplifier enable unit 10. The delayed sense amplifier enable signal is coupled such that its assertion causes the word line enable signal to be deasserted (shown as the "word line kill" path in FIG. 2) and also causes the sense amplifier enable signal output itself to be deasserted (shown as the "sense amp enable self-timed loop" path in FIG. 2) (block 504). Because deassertion of both the word line enable and the sense amplifier enable signals is dependent upon the amount of time needed for assertion of the sense amplifier enable signal to propagate back to the circuit input, the deassertion of these signals may be said to be "self-timed," in that the deassertion does not depend upon a clock edge.

Thus, during operation, the word line enable signal may first be enabled, allowing the values of the various storage cells to be coupled onto their respective bit lines. After some delay, the sense amplifier enable signal may be enabled, causing the sense amplifiers to capture the values on the bit lines. Once this capture occurs, it may no longer be necessary to drive either the word line enable or the sense amplifier enable. The self-timed deassertion of these signals as shown in FIG. 4 may enable these signals to be turned off sooner than a clock-synchronous deassertion, which may reduce power consumption. At the same time, the frequency-dependent (i.e., synchronous) assertion of these signals may more easily permit the memory array to operate dependably at a range of frequencies. It is noted that although both the word line enable and sense amplifier enable have been described as having frequency-dependent and self-timed features, it is possible to implement some or all of these features with respect to either the word line enable or the sense amplifier enable without necessarily implementing them with respect to both signals.

Figure 6:
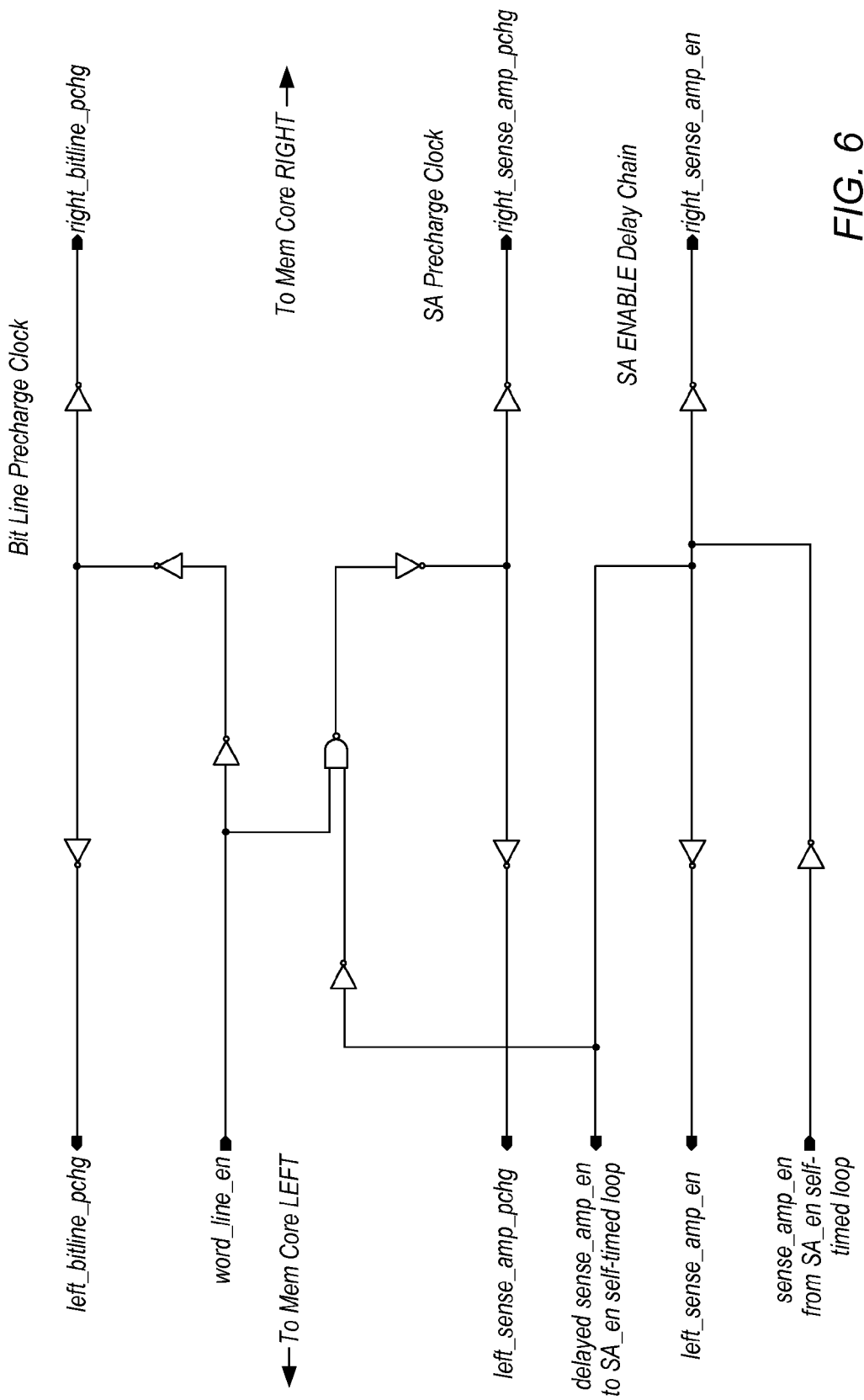
FIG. 6 illustrates an embodiment of a circuit that may be used in conjunction with the word line control/sense amplifier enable unit of FIG. 4.

FIG. 6 illustrates an embodiment of a circuit that may be used in conjunction with word line control/sense amplifier enable unit 10. In some embodiments, the illustrated circuit may be embedded within storage cell arrays situated to the left and right of the circuit. In the illustrated embodiment, the word line enable and sense amplifier enable signals generated in FIG. 4 are provided as inputs. The word line enable signal is buffered and split to control bit line precharge operation for the left and right arrays. The sense amplifier enable signal is buffered and split to control the sense amplifiers for the left and right arrays, and is also fed back to circuit 400 of unit 10 as discussed above. Both the word line enable and sense amplifier enable are used to control sense amplifier precharge operation for the left and right arrays.

Combined Sense Amplifier, Latch, and Mux

As shown in FIG. 2 and discussed above, in some embodiments, a sense amplifier may be employed to convert the low-voltage differential output of a pair of bit lines into a static or dynamic logic signal suitable for use by logic downstream from the memory array. Other operations may also be performed on data that is read from the storage cells via the bit lines before the final data output of the memory array is provided. For example, in some implementations, it may be necessary to synchronize the data with a latch, flip-flop, or other timing element prior to driving the output data to its destination.

Also, in some embodiments, it may be desired to selectively override the data from the memory array with data from some other source. For example, during circuit test operations, it may be desirable to selectively provide a known test pattern to logic that is downstream from the memory array. To do so, the memory array data may be multiplexed with other sources of test data prior to generation of the memory array final data output.

In some embodiments, multiple different types of test modes may be used, where different test modes involve different sources of test data. For example, a scan mode may be provided for performing testing via a scan chain, such as a JTAG scan chain. However, scan mode testing typically is performed at a clock speed that is lower than the full operational speed of the circuit being tested, sometimes by an order of magnitude or more. Thus, while scan mode testing may be useful in determining whether a circuit is basically functional, it may not be as useful for identifying frequency-dependent problems. Accordingly, in some embodiments, a test mode separate from scan mode may be provided for at-speed testing (i.e., testing at or around the normal operating frequency for which the circuit was designed). Because the scan chain provided for scan mode testing may not be capable of operating at the full design speed of the circuit (e.g., due to limitations of external tester equipment), a test data source that is separate from the scan data may be used for at-speed testing. In some instances, this alternative data source may be referred to as "bypass data." In various embodiments, the source of the bypass data may be another functional circuit element (i.e., a circuit element that operates during normal functional mode operation, such as a register, latch, array, or other circuit within datapath or control logic), a test circuit element (i.e., a circuit element that operates during test mode operation and has no effect on normal functional mode operation of the circuit), a circuit element that is operable in both functional mode and test mode operation (though possibly with different characteristics depending on the selected mode), or any other suitably defined data source.

However, adding latches, multiplexers, or other logic between the sense amplifiers and the memory array final data output may complicate the array design. Because a large number of bits may be read from the array in parallel, the additional logic may consume a substantial amount of area when multiplied across the total number of data bits being read. Inserting logic into this path may also increase the latency of the data read path through the array, which may reduce the frequency at which the array can reliably operate.

Figure 7:
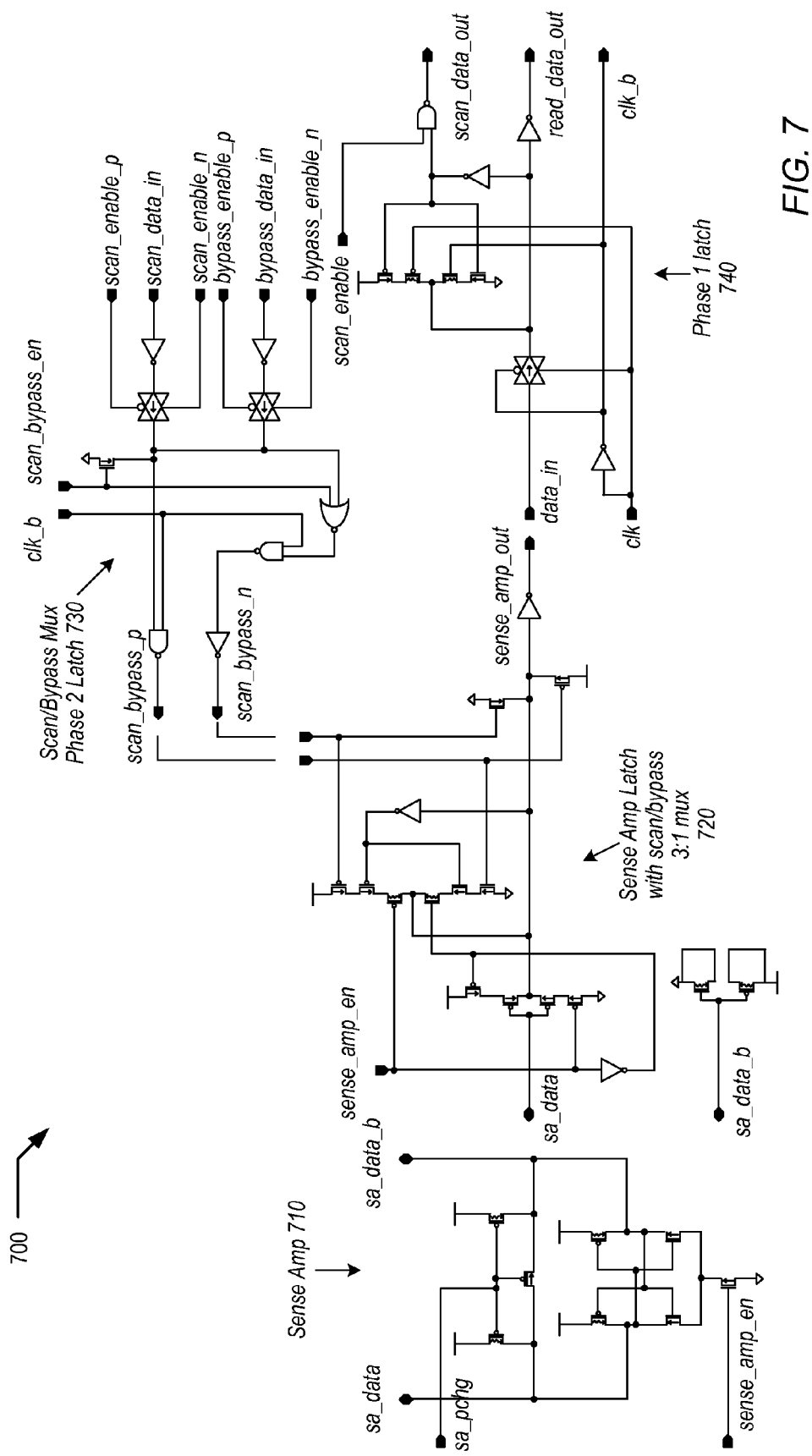
FIG. 7 illustrates an embodiment of a circuit that integrates the functionality of a sense amplifier, a latch, and a multiplexer.

FIG. 7 illustrates an embodiment of a circuit 700 that integrates the functionality of a sense amplifier, a latch, and a multiplexer in a manner that may reduce the overall size of the circuit while maintaining or improving circuit performance. In some embodiments, the circuit of FIG. 7 may be implemented in whole or in part by sense amplifier/output logic unit 40 shown in FIG. 2 or output driver 2 of FIG. 1, though it may be used in any suitable memory array organization.

In the illustrated embodiment, the circuit includes a sense amplifier 710 coupled to a sense amp latch 720, where both the sense amplifier and the latch are controlled by the same sense amplifier enable signal. In combination with scan/bypass mux 730, sense amp latch 720 further implements a 3:1 multiplexer that selects from among the sense amplifier output data, scan data, or bypass data. The output of sense amp latch 720 is coupled to a scannable latch 740 controlled by the opposite phase clock with respect to sense amp latch 720, effectively creating a master-slave flip-flop in terms of timing behavior. Further details regarding these various components are illustrated in FIGS. 8-11. In some embodiments, an instance of circuit 700 may be included for each column of storage cells in an array. For example, for each given column, an instance of sense amplifier 710 may be coupled to the one or more bit lines corresponding to the given column, an instance of sense amp latch 720 may be coupled to the sense amplifier 710 corresponding to the given column, and so forth.

Figure 8:
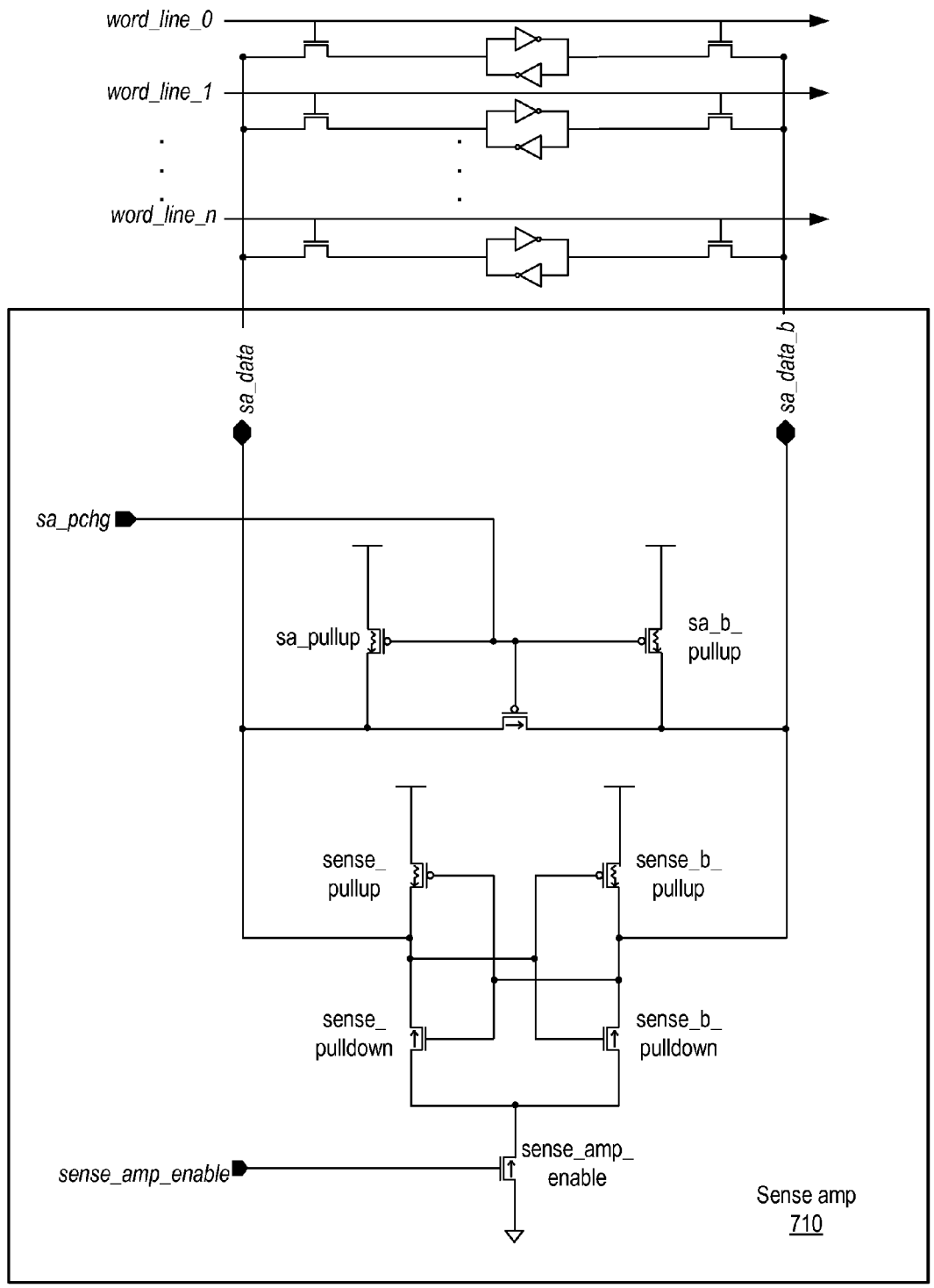
FIG. 8 illustrates an embodiment of a sense amplifier circuit.

FIG. 8 illustrates an embodiment of sense amplifier 710 that may be coupled to receive data from the bit lines driven from the memory cells within the array. For example, the top portion of FIG. 8 illustrates a number of memory cells, each of which may be coupled to the bit lines by a respective word line. The memory cells may correspond, for example, to storage elements 1 of FIG. 1, or to memory cells 30 of FIG. 2. The bottom portion of FIG. 8 illustrates sense amplifier 710 itself. In some embodiments, the bit lines driven from the memory cells may be coupled to sense amplifier 710 through a controllable device, such as a pass transistor (not shown). In other embodiments, the bit lines may couple directly to the sa_data and sa_data_b inputs of the sense amplifier. In some embodiments, the arrangement of memory cells, bit lines, and the sense amplifier shown in FIG. 8 may be replicated a number of times to form an array of rows and columns.

In the illustrated embodiment, sense amplifier 710 may be coupled to a column of storage cells of an array via a differentially-encoded pair of bit line signals. For example, the two bit lines driven by the storage cells may be configured such that when no array access is occurring, the bit lines are maintained at the same voltage (e.g., a precharged or discharged state). When a valid array access is occurring, the bit lines may be driven to opposite voltage states, such that the voltage of one bit line is higher than the voltage of the other bit line. Which bit line carries the higher voltage may depend on the value (e.g., a logic one or a logic zero) that is stored in the storage cell that is coupled to the bit lines during the array access.

Ordinarily, a digital circuit employs two distinct voltages to represent a logic zero and a logic one. For example, a logic zero is often represented by a voltage ground, whereas a logic one is often represented by a positive supply voltage. In some instances, signals falling within a certain range of ground are treated as "true" logic zeros, whereas signals falling within a certain range of the positive supply voltage are treated as "true" logic ones, such that there exists a minimum voltage difference between a true logic zero and a true logic one.

However, in a memory array, it may be impractical to design internal signals that use the same voltage definitions for logic states that are employed outside the array. For example, hundreds of storage cells may be coupled to a given bit line, creating a large capacitive load that must be accounted for when the bit line transitions. As the size of the voltage transition across a large capacitive load increases, more power and/or time is typically required to perform the transition, which may negatively affect the performance of the array. Correspondingly, in some embodiments, the bit lines within the memory array are implemented with a differential encoding that employs a smaller voltage differential to represent a valid data value than the voltage differential between a true logic zero and one as defined externally to the array. For example, the voltage differential between the bit lines during evaluation may be only tens or hundreds of millivolts, as compared to the one or more volt gap between a true logic zero and a true logic one outside the memory array.

It is noted that although a differentially-encoded pair of bit lines may be less susceptible to phenomena such as common-mode noise, a single bit line may also be implemented using a single-ended encoding that is relative to ground instead of relative to the voltage on a complementary bit line. With corresponding modifications, the techniques described herein are also applicable to a single-ended implementation.

Figure 9:
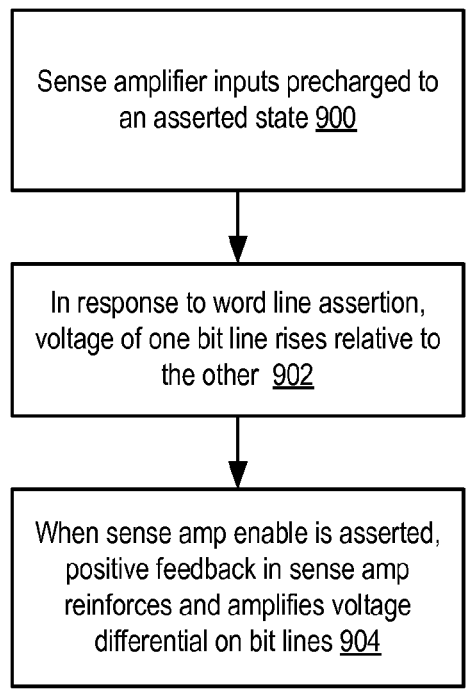
FIG. 9 illustrates an example of a method of operation of an embodiment of a sense amplifier circuit.

In some embodiments, sense amplifier 710 may be configured to convert the smaller voltage differential that exists across the bit lines into the larger voltage differential that may be employed by downstream circuitry to represent a true logic zero or one. An embodiment of a method of operation of sense amplifier 710 is shown in FIG. 9. In the illustrated embodiment, the sense amplifier data inputs sa_data and sa_data_b may both be precharged to an asserted state by the sa_pchg signal (block 900). The bit lines may be similarly precharged by a separate signal. For example, the sense_amp_pchg and bitline_pchg signals shown in FIG. 6 may be employed to perform these operations.

When a particular word line is asserted, a value stored in a corresponding memory cell may be coupled to the bit lines, causing the voltage of one of the bit lines to rise relative to the other, complementary bit line (block 902). The pullup and pulldown devices in the sense amplifier form a positive feedback amplifier that reinforces this voltage differential when the sense amplifier enable signal is asserted (block 904). For example, if the voltage on sa_data_b drops relative to sa_data, this drop tends to cut off the device sense_pulldown and to turn on the device sense_pullup, causing the device sense_pullup to increase the voltage on sa_data. Via the cross-coupled inverters, the increased voltage on sa_data tends to cut off the device sense_b_pullup and the turn on the device sense_b_pulldown, causing the device sense_b_pulldown to decrease the voltage on sa_data_b. This behavior is self-reinforcing, causing sa_data to be driven towards the supply voltage and sa_data_b to be driven towards ground. Similar behavior occurs with the opposite polarity in the event that the voltage on sa_data drops relative to sa_data_b when a word line is selected.

Figure 11:
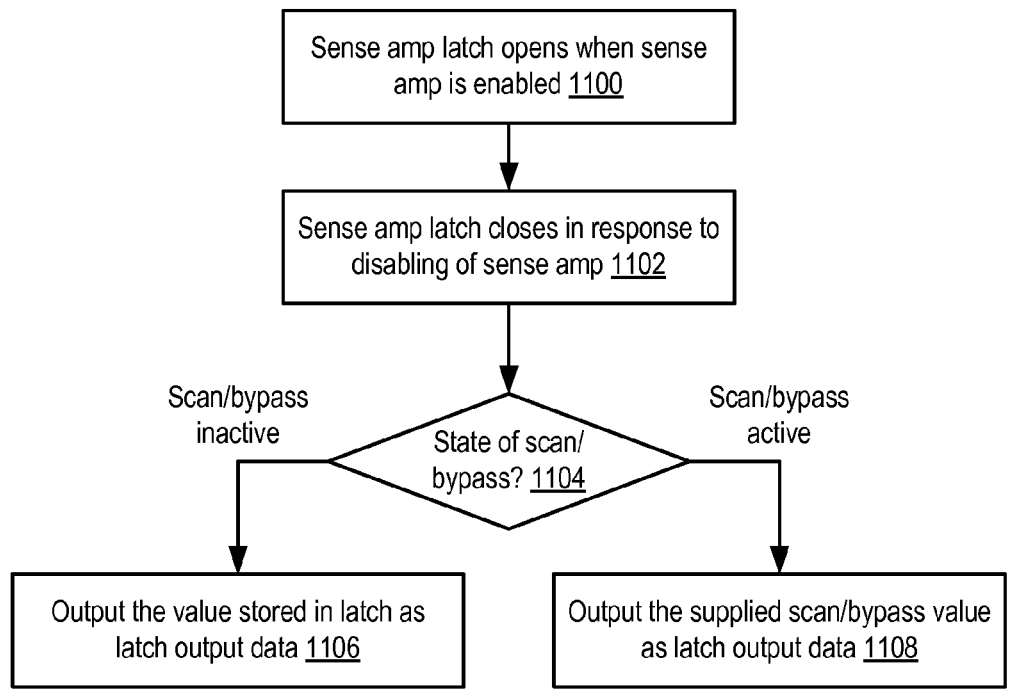
FIG. 11 illustrates an example of a method of operation of a latch that incorporates multiplexer functionality.
Figure 10:
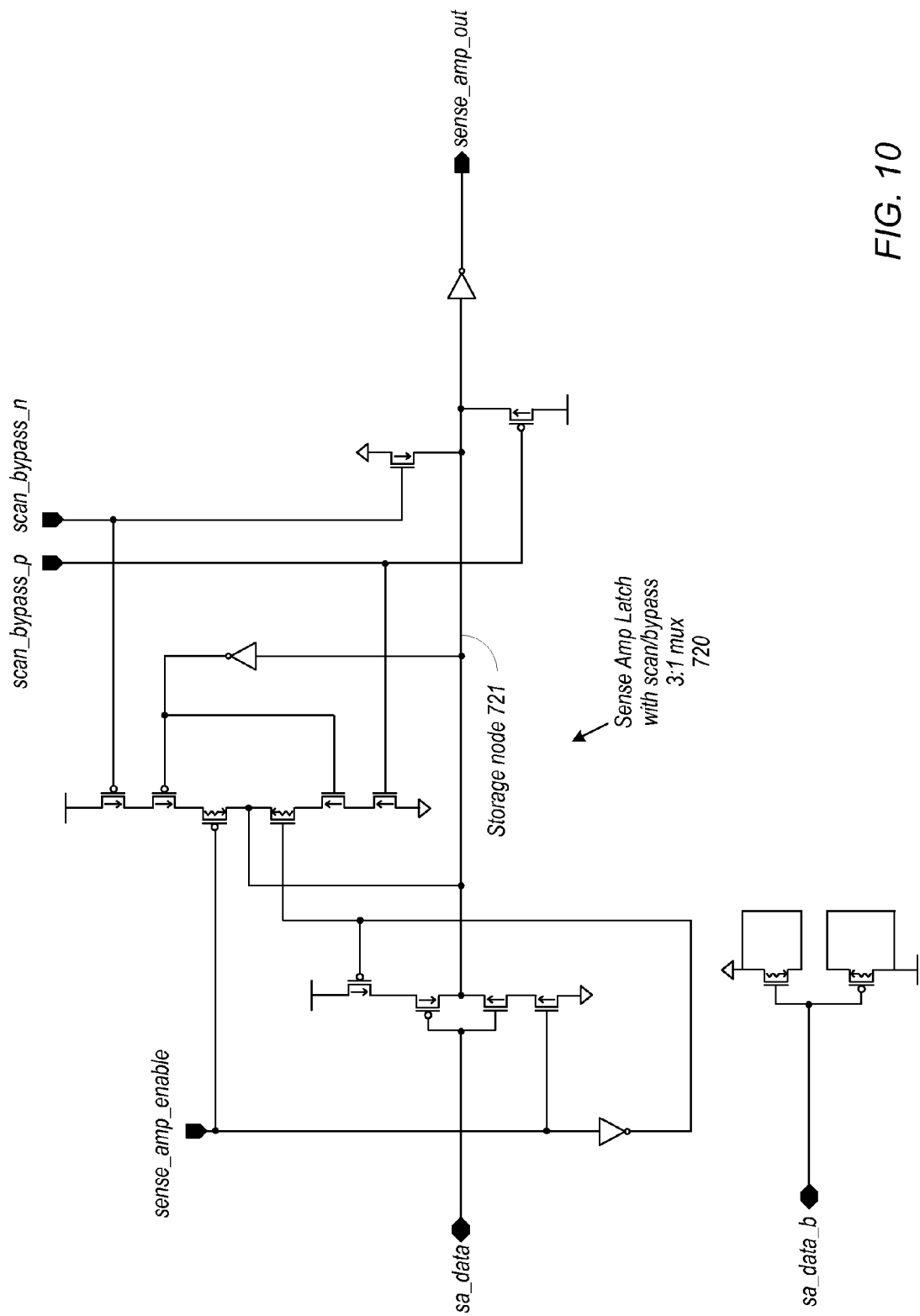
FIG. 10 illustrates an embodiment of a latch that incorporates multiplexer functionality.

FIGS. 10-11 illustrate an embodiment of sense amp latch 720 that incorporates multiplexer functionality, as well as a method of its operation. In the illustrated embodiment, sense amp latch 720 is coupled to receive the input sa_data from sense amplifier 710 shown in FIG. 8. (The opposite polarity signal sa_data_b is terminated and unused in this embodiment.) In some embodiments, the latch enable signal is controlled by the same sense amplifier enable signal that controls sense amplifier 710. Thus, in the illustrated embodiment, the latch is "open" (i.e., capable of capturing the value at its data input) at the same time the sense amplifier is active and evaluating (block 1100). When open, the value present at the input to sense amp latch 720 is coupled to internal storage node 721.

When the sense amplifier is disabled (e.g., by the self-timed circuit discussed above with respect to FIG. 2), the latch "closes." That is, sense amp latch 720 captures and stores the value present at storage node 721, such that further changes at the data input do not affect the stored value at storage node 721 so long as the latch enable signal is deasserted) (block 1102). In this case, the behavior of sense amp latch 720 depends on the state of the scan bypass input signals (block 1104). When inactive, the inputs scan_bypass_p and scan_bypass_n (discussed in greater detail below) indicate that the value stored within the latch should be presented as the latch output data (block 1106). For example, when inactive the scan_bypass_p and scan_bypass_n inputs may be driven to a high and low voltage, respectively. This, coupled with the deassertion of the sense amplifier enable signal, causes the outermost two P-type and N-type devices in the six-transistor stack to be placed in a conducting state, such that the remaining two transistors and the illustrated inverter form an inverter pair that maintains the data value sampled from the sa_data input node on the internal node denoted "storage_node."

When active, the scan_bypass_p and scan_bypass_n indicate that the value stored within the latch should be overridden with a scan or bypass test value (block 1108). If the test value to be passed to the sense amplifier output sense_amp_out is a logic 1, scan_bypass_n is driven to a high voltage while scan_bypass_p remains in its inactive high voltage state. This causes the top P-type device in the six-transistor stack to turn off, decoupling the inverter pair from storage_node. At the same time, the single N-type device coupled to scan_bypass_n activates, discharging the node storage_node, and resulting in assertion of sense_amp_out.

Conversely, if the test value to be passed to the sense amplifier output sense_amp_out is a logic 0, scan_bypass_p is driven to a low voltage while scan_bypass_n remains in its inactive low-voltage state. This causes the bottom N-type device in the six-transistor stack to turn off, decoupling the inverter pair from storage_node. At the same time, the single P-type device coupled to scan_bypass_p activates, charging the node storage_node, and resulting in deassertion of sense_amp_out. Thus, the scan_bypass_p and scan_bypass_n inputs effectively form a 2:1 multiplexer in combination with the latch.

Figure 12:
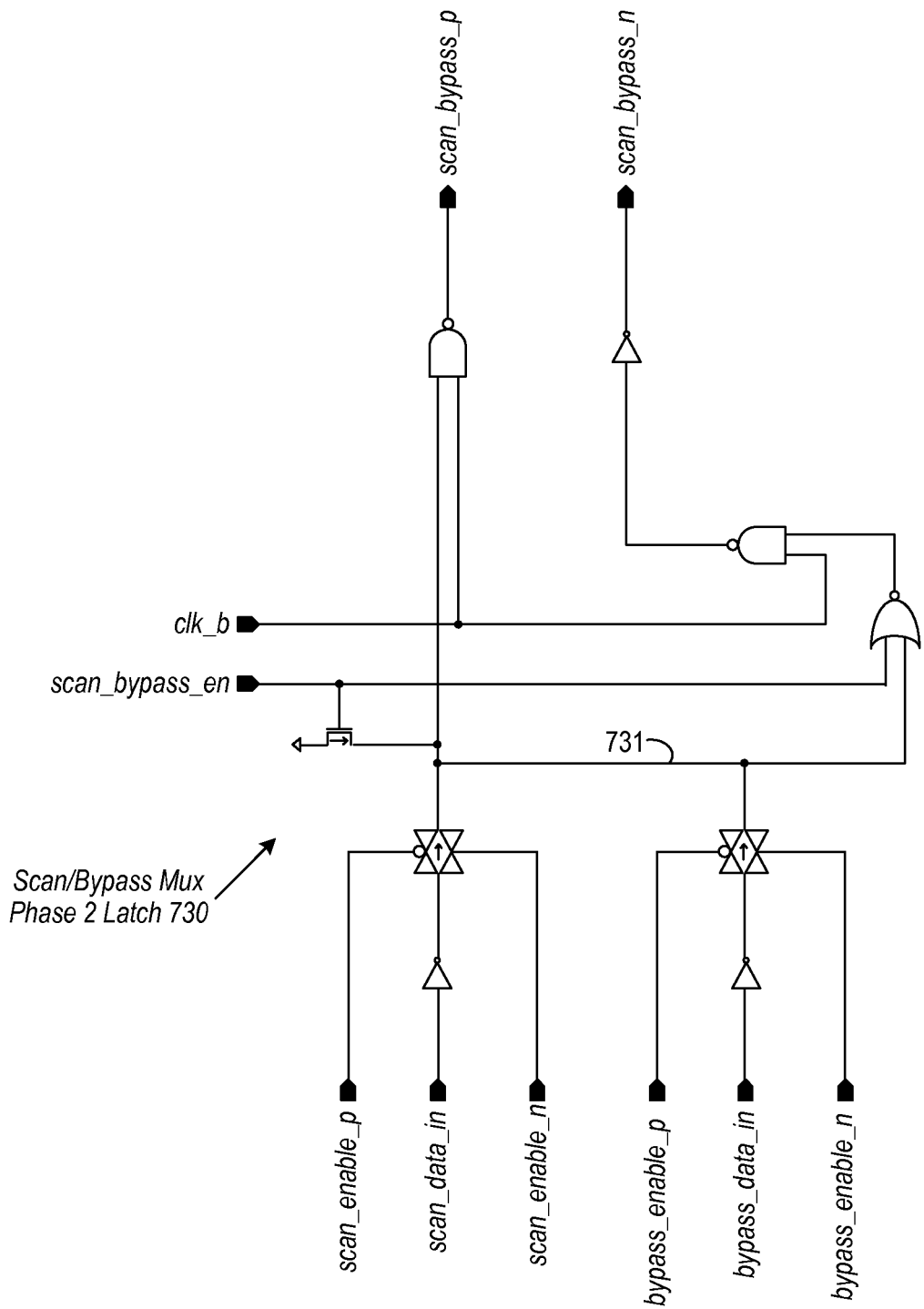
FIG. 12 illustrates an embodiment of a multiplexer circuit that generates signals that may be used by the circuit of FIG. 10.
Figure 13:
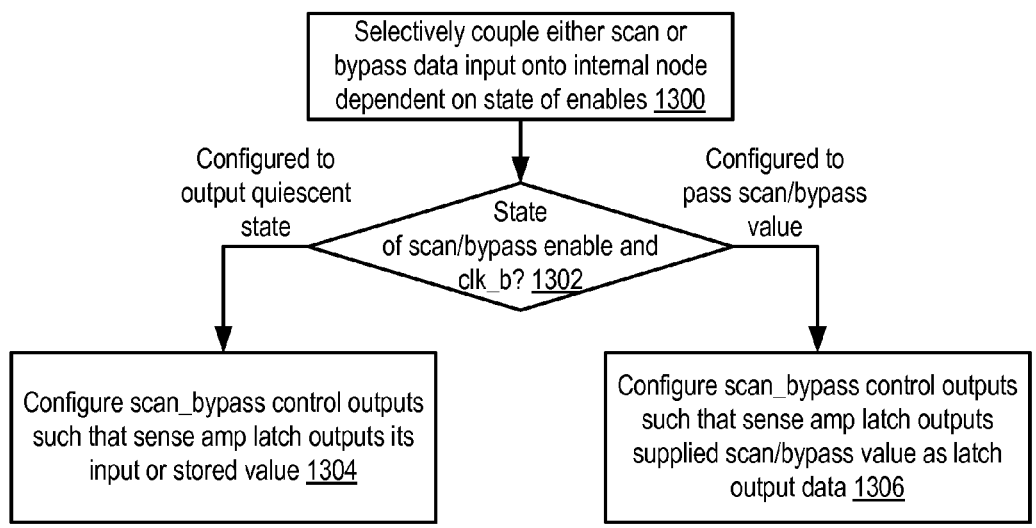
FIG. 13 illustrates an example of a method of operation of the circuit of FIG. 12.

FIG. 12 illustrates an embodiment of scan/bypass mux 730 that may be configured to generate the scan_bypass_p and scan_bypass_n signals that may be used by sense amp latch 720 as shown in FIG. 10. FIG. 13 illustrates an example of a method of operation of scan/bypass mux 730. In the illustrated embodiment, a pair of pass-gate structures may be arranged to selectively couple either a scan data value or a bypass data value onto internal node 731, depending on the state of the enable_n and enable_p inputs (block 1300).

For example, the illustrated pass gate structure may be "open," allowing a value to pass from its input to its output, when the enables are asserted (e.g., when the enable_n input is at a high voltage and the enable_p input is at a low voltage). Otherwise, the pass gate may be in a nonconducting state, such as a high impedance state. In some embodiments, the enable_p and enable_n signals may be derived from a single input with an inverter coupled to generate either the enable_p or the enable_n signal depending on the sense of the input. External logic may control the enables such that at most one set of the scan_enable or bypass_enable signals is asserted at a given time. Thus, in some embodiments, the pass-gate structures may operate as a 2:1 mux that either passes a scan data value, a bypass data value, or a high-impedance value onto node 731.

Whether or not the value of node 731 is passed through to the output of scan/bypass mux 730 further depends on the state of the scan_bypass_en input signal and the clk_b input signal (block 1302). In some instances, scan_bypass_en may be configured such that it is in a low state when scan/bypass mode is active (e.g., in a mode where the input of scan/bypass mux 730 should be presented on the output of sense amp latch 720), and in a high state when scan/bypass mode is inactive. Further, scan/bypass mux 730 may be configured such that its output may be clock-dependent. It is contemplated that in other embodiments, different encodings and/or different combinations of signals may be used to control the behavior of scan/bypass mux 730. For example, a different encoding of scan_bypass_en or a different clock phase may be used, the clock may be omitted entirely, etc.

In one possible mode of operation, the scan_bypass_en and clk_b inputs may be configured to output control signals from scan/bypass mux 730 that are quiescent with respect to sense amp latch 720, and therefore cause sense amp latch 720 to output its input or stored value, rather than the scan/bypass data input to scan/bypass mux 730 (block 1304). In the illustrated embodiment, if either the scan_bypass_en input signal is high or the clk_b input signal is low (or both), the scan_bypass_p and scan_bypass_n outputs may be in high and low states, respectively. As noted above with respect to FIG. 10, these states are quiescent with respect to sense amp latch 720 and will cause the input or stored value of sense amp latch 720 to be passed as the output value of that circuit regardless of the state of the inputs to the pass gates of scan/bypass mux 730.

In another mode of operation, the scan_bypass_en and clk_b inputs may be configured to output control signals from scan/bypass mux 730 that indicate that the scan/bypass data value input to scan/bypass mux 730 should be driven from sense amp latch 720 as the output of latch 720 (block 1306). That is, the scan_bypass_en and clk_b control inputs may cause scan/bypass mux 730 to output values that override the value stored in sense amp latch 720. For example, if the scan_bypass_en input signal is low and the clk_b input signal is high, then the values of scan_bypass_p and scan_bypass_n depend on the value of node 731 (as determined from the scan_data_in or the bypass_data_in inputs to the pass gates). If the value of node 731 is high, then both the scan_bypass_p and scan_bypass_n outputs may be high, causing a high value to be multiplexed onto the output of sense amp latch 720 of FIG. 10. Conversely, if the value of node 731 is low, then both the scan_bypass_p and scan_bypass_n outputs may be low, causing a low value to be multiplexed onto the output of sense amp latch 720.

It is noted that in the illustrated embodiment, the scan_bypass_p and scan_bypass_n signal may collectively correspond to a test data signal that encodes both control information and a data value. For example, as described above, when scan_bypass_p and scan_bypass_n are both high, this encoding may reflect both a high data value and a command that the high data value be multiplexed onto the output of sense amp latch 720, instead of the internally stored value of sense amp latch 720. Likewise, when scan_bypass_p and scan_bypass_n are both low, this encoding may reflect both a low data value and a command that the low data value be multiplexed onto the output of sense amp latch 720, instead of the internally stored value of sense amp latch 720. Additionally, when scan_bypass_p and scan_bypass_n are in high and low states, respectively, this encoding may reflect a command that the internally stored value of sense amp latch 720 be multiplexed onto the latch output.

In some instances, scan_bypass_p may be referred to as a pulldown signal, and the P-type device to which scan_bypass_p is coupled may be referred to as a pulldown device, in that when scan_bypass_p is active (in this example, low), the output of sense amp latch 720 will be a low value. For example, when scan_bypass_p is low, the P-type device will be on, causing a high value to be presented to the output inverter, and a corresponding low value to be driven from the output inverter. Similarly, scan_bypass_n and the N-type device to which it is coupled may be referred to as a pullup signal and a pullup device, respectively, in that they have the opposite effect. It is noted that in other embodiments, the output of sense amp latch 720 may not be inverted relative to storage node 721. In such embodiments, the sense of scan_bypass_p and scan_bypass_n may need to be reversed relative to the illustrated embodiment.

It is noted that in some embodiments, the control and data aspects of the test data signal cannot be determined from individual components of the test data signal considered separately, but instead depend on multiple components of the test data signal. For example, in the embodiment just described, whether or not test data should override internal latch data (and if so, the test data value that should be used) cannot be determined from scan_bypass_p or scan_bypass_n alone, but instead depends on the state of both of these components.

As described above, the implementation of distinct test modes (such as scan and bypass modes) with distinct test data sources may give rise to a need for multiplexing memory array data with several other sources of test data prior to driving the array output to its destination. However, it is contemplated that in some embodiments, the distinct test data sources need not necessarily correspond to distinct modes of test operation such as low-speed scan vs. at-speed testing. Moreover, in some embodiments, the data sources with which the memory array data is multiplexed need not be test data sources at all. That is, the circuits described above are not necessarily limited to multiplexing of test data. Rather, in some embodiments, the memory array data may be multiplexed with any other source of data for any reason.

Figure 14:
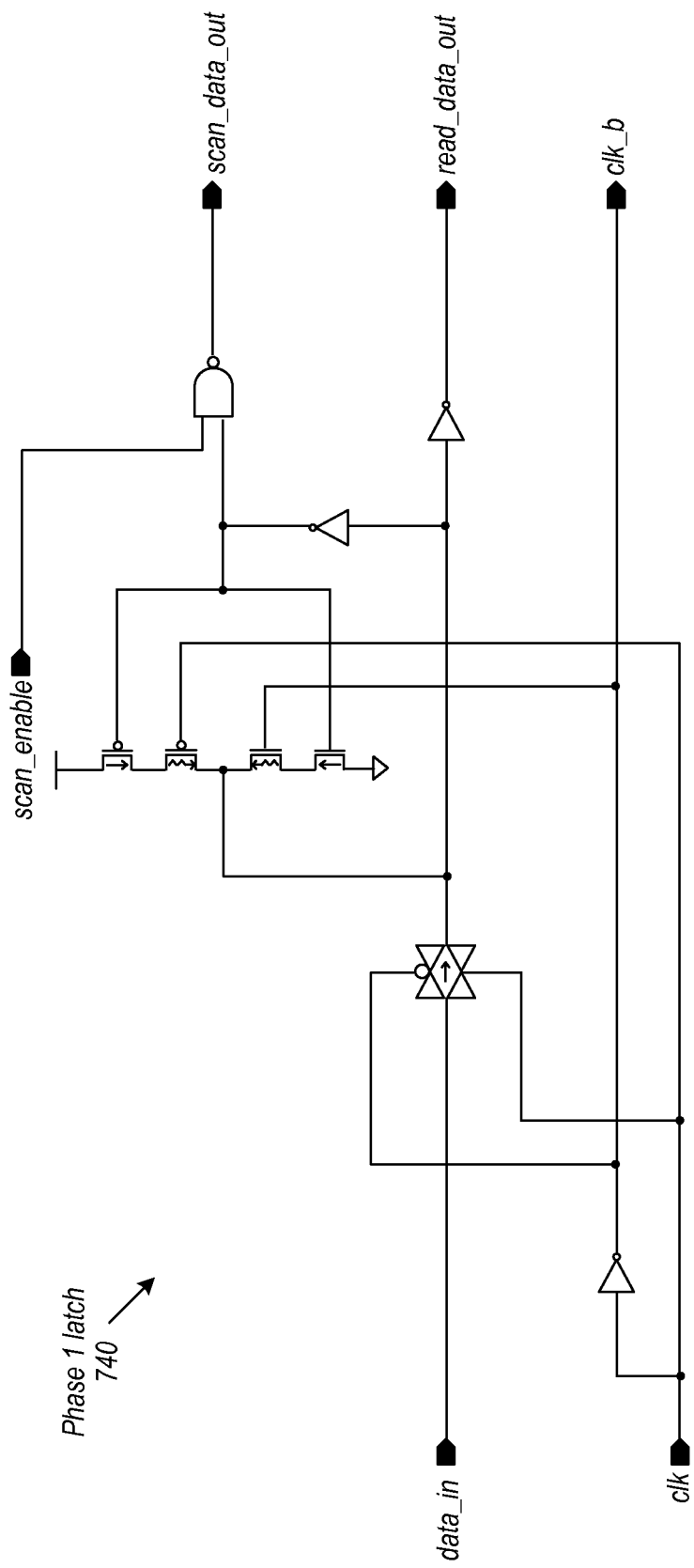
FIG. 14 illustrates an embodiment of a scannable latch.

FIG. 14 illustrates an embodiment of scannable latch 740 that may be employed to latch the memory array data prior to driving it to its destination. In the illustrated embodiment, latch 740 may generally operate in a manner similar to sense amp latch 720 of FIG. 10, in that it may be operable to capture an input value during one phase of the clock and to store the captured value during another phase of the clock. As shown, scannable latch 740 differs in several structural respects from sense amp latch 720. For example, the multiplexer logic of sense amp latch 720 relating to scan/bypass functionality may be omitted, and a pass gate structure instead of a clocked inverter is shown at the front end of scannable latch 740. In the illustrated embodiment, scannable latch 740 is clocked by a clock signal rather than by the sense amplifier enable signal, as with sense amp latch 720. Additionally, the illustrated embodiment includes a separately-enabled scan data output that is distinct from the primary data output.

As described above, in some embodiments, a sense amplifier latch circuit may be configured to latch the output of a sense amplifier. The sense amplifier itself may be enabled by a sense amplifier enable signal, and the sense amplifier latch circuit may be configured to be controlled by the same sense amplifier enable signal. That is, instead of a typical clock signal, the sense amplifier enable signal may be employed as a "clock" to control the sense amplifier latch circuit. In some embodiments, the sense amplifier enable signal may be generated such that it is asserted in a frequency-dependent fashion, but deasserted in a self-timed fashion. That is, the sense amplifier enable signal may deassert itself after a frequency-independent period of time, as described above with respect to FIG. 4. Using such a signal to control the sense amplifier latch circuit may in some cases result in power savings, simplified circuit timing, and/or a more compact design, in that the operation of the sense amplifier latch may be more closely correlated in time to the operation of the sense amplifier than if a separate clock were used to control the sense amplifier latch circuit.

Also, in some embodiments, the sense amplifier latch circuit may be combined with multiplexer circuitry in order to merge scan/bypass mux functionality within the latch itself. In some cases, the combined latch/multiplexer may use less area and/or may exhibit better timing performance than alternative designs. Because of the high degree of replication of such structures within arrays, improvements in design area of such a circuit may accumulate to a significant degree with respect to an array as a whole.

Processor Overview

Figure 15:
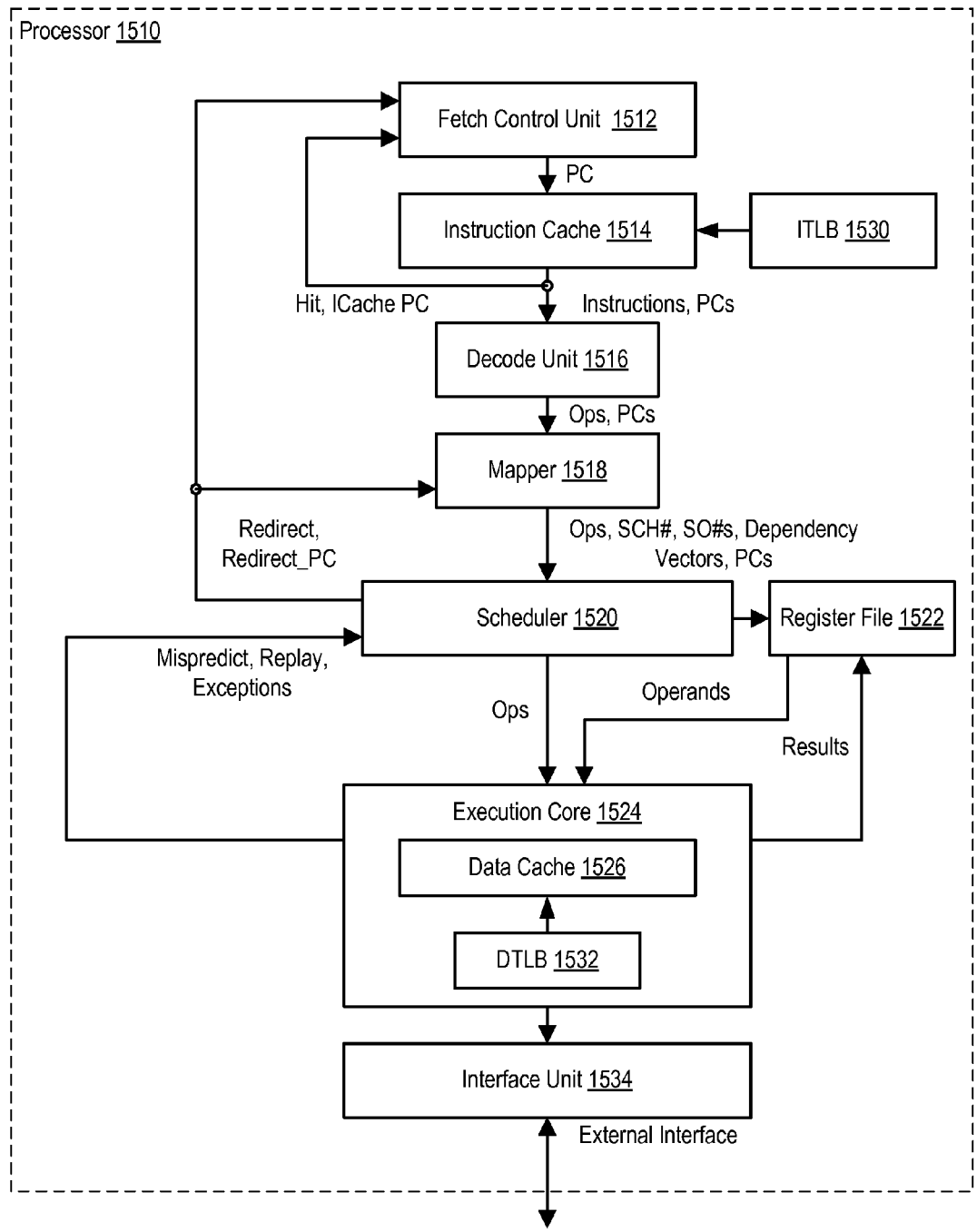
FIG. 15 illustrates an embodiment of a processor that may include one or more memory arrays.

Turning now to FIG. 15, a block diagram of an embodiment of a processor 1510 is shown. Processor 1510 may include one or more memory arrays that incorporate some or all of the features described above. For example, such arrays may be included within caches, buffers, register files, or other storage structures that may be included within processor 1510 for various purposes. Such arrays may be employed to store instructions for execution (including information derived from decoding of instructions), data operated on during execution of instructions (including results of such operations), and/or any other processor state information used during execution of instructions.

In the illustrated embodiment, the processor 1510 includes a fetch control unit 1512, an instruction cache 1514, a decode unit 1516, a mapper 1518, a scheduler 1520, a register file 1522, an execution core 1524, and an interface unit 1534. The fetch control unit 1512 is coupled to provide a program counter address (PC) for fetching from the instruction cache 1514. The instruction cache 1514 is coupled to provide instructions (with PCs) to the decode unit 1516, which is coupled to provide decoded instruction operations (ops, again with PCs) to the mapper 1518. The instruction cache 1514 is further configured to provide a hit indication and an ICache PC to the fetch control unit 1512. The mapper 1518 is coupled to provide ops, a scheduler number (SCH#), source operand numbers (SO#s), one or more dependency vectors, and PCs to the scheduler 1520. The scheduler 1520 is coupled to receive replay, mispredict, and exception indications from the execution core 1524, is coupled to provide a redirect indication and redirect PC to the fetch control unit 1512 and the mapper 1518, is coupled to the register file 1522, and is coupled to provide ops for execution to the execution core 1524. The register file is coupled to provide operands to the execution core 1524, and is coupled to receive results to be written to the register file 1522 from the execution core 1524. The execution core 1524 is coupled to the interface unit 1534, which is further coupled to an external interface of the processor 1510.

Fetch control unit 1512 may be configured to generate fetch PCs for instruction cache 1514. In some embodiments, fetch control unit 1512 may include one or more types of branch predictors. For example, fetch control unit 1512 may include indirect branch target predictors configured to predict the target address for indirect branch instructions, conditional branch predictors configured to predict the outcome of conditional branches, and/or any other suitable type of branch predictor. During operation, fetch control unit 1512 may generate a fetch PC based on the output of a selected branch predictor. If the prediction later turns out to be incorrect, fetch control unit 1512 may be redirected to fetch from a different address. When generating a fetch PC, in the absence of a nonsequential branch target (i.e., a branch or other redirection to a nonsequential address, whether speculative or nonspeculative), fetch control unit 1512 may generate a fetch PC as a sequential function of a current PC value. For example, depending on how many bytes are fetched from instruction cache 1514 at a given time, fetch control unit 1512 may generate a sequential fetch PC by adding a known offset to a current PC value.

The instruction cache 1514 may be a cache memory for storing instructions to be executed by the processor 1510. The instruction cache 1514 may have any capacity and construction (e.g. direct mapped, set associative, fully associative, etc.). The instruction cache 1514 may have any cache line size. For example, 64 byte cache lines may be implemented in an embodiment. Other embodiments may use larger or smaller cache line sizes. In response to a given PC from the fetch control unit 1512, the instruction cache 1514 may output up to a maximum number of instructions. It is contemplated that processor 1510 may implement any suitable instruction set architecture (ISA), such as, e.g., the ARM™, PowerPC™, or x86 ISAs, or combinations thereof.

In some embodiments, processor 1510 may implement an address translation scheme in which one or more virtual address spaces are made visible to executing software. Memory accesses within the virtual address space are translated to a physical address space corresponding to the actual physical memory available to the system, for example using a set of page tables, segments, or other virtual memory translation schemes. In embodiments that employ address translation, the instruction cache 1514 may be partially or completely addressed using physical address bits rather than virtual address bits. For example, instruction cache 1514 may use virtual address bits for cache indexing and physical address bits for cache tags.

In order to avoid the cost of performing a full memory translation when performing a cache access, processor 1510 may store a set of recent and/or frequently-used virtual-to-physical address translations in a translation lookaside buffer (TLB), such as Instruction TLB (ITLB) 1530. During operation, ITLB 1530 (which may be implemented as a cache, as a content addressable memory (CAM), or using any other suitable circuit structure) may receive virtual address information and determine whether a valid translation is present. If so, ITLB 1530 may provide the corresponding physical address bits to instruction cache 1514. If not, ITLB 1530 may cause the translation to be determined, for example by raising a virtual memory exception.

The decode unit 1516 may generally be configured to decode the instructions into instruction operations (ops). Generally, an instruction operation may be an operation that the hardware included in the execution core 1524 is capable of executing. Each instruction may translate to one or more instruction operations which, when executed, result in the operation(s) defined for that instruction being performed according to the instruction set architecture implemented by the processor 1510. In some embodiments, each instruction may decode into a single instruction operation. The decode unit 1516 may be configured to identify the type of instruction, source operands, etc., and the decoded instruction operation may include the instruction along with some of the decode information. In other embodiments in which each instruction translates to a single op, each op may simply be the corresponding instruction or a portion thereof (e.g. the opcode field or fields of the instruction). In some embodiments in which there is a one-to-one correspondence between instructions and ops, the decode unit 1516 and mapper 1518 may be combined and/or the decode and mapping operations may occur in one clock cycle. In other embodiments, some instructions may decode into multiple instruction operations. In some embodiments, the decode unit 1516 may include any combination of circuitry and/or microcoding in order to generate ops for instructions. For example, relatively simple op generations (e.g. one or two ops per instruction) may be handled in hardware while more extensive op generations (e.g. more than three ops for an instruction) may be handled in microcode.

Ops generated by the decode unit 16 may be provided to the mapper 1518. The mapper 1518 may implement register renaming to map source register addresses from the ops to the source operand numbers (SO#s) identifying the renamed source registers. Additionally, the mapper 1518 may be configured to assign a scheduler entry to store each op, identified by the SCH#. In an embodiment, the SCH# may also be configured to identify the rename register assigned to the destination of the op. In other embodiments, the mapper 1518 may be configured to assign a separate destination register number. Additionally, the mapper 1518 may be configured to generate dependency vectors for the op. The dependency vectors may identify the ops on which a given op is dependent. In an embodiment, dependencies are indicated by the SCH# of the corresponding ops, and the dependency vector bit positions may correspond to SCH#s. In other embodiments, dependencies may be recorded based on register numbers and the dependency vector bit positions may correspond to the register numbers.

The mapper 1518 may provide the ops, along with SCH#, SO#s, PCs, and dependency vectors for each op to the scheduler 1520. The scheduler 1520 may be configured to store the ops in the scheduler entries identified by the respective SCH#s, along with the SO#s and PCs. The scheduler may be configured to store the dependency vectors in dependency arrays that evaluate which ops are eligible for scheduling. The scheduler 1520 may be configured to schedule the ops for execution in the execution core 1524. When an op is scheduled, the scheduler 1520 may be configured to read its source operands from the register file 1522 and the source operands may be provided to the execution core 1524. The execution core 1524 may be configured to return the results of ops that update registers to the register file 1522. In some cases, the execution core 1524 may forward a result that is to be written to the register file 1522 in place of the value read from the register file 1522 (e.g. in the case of back to back scheduling of dependent ops).

The execution core 1524 may also be configured to detect various events during execution of ops that may be reported to the scheduler. Branch ops may be mispredicted, and some load/store ops may be replayed (e.g. for address-based conflicts of data being written/read). Various exceptions may be detected (e.g. protection exceptions for memory accesses or for privileged instructions being executed in non-privileged mode, exceptions for no address translation, etc.). The exceptions may cause a corresponding exception handling routine to be executed.

The execution core 1524 may be configured to execute predicted branch ops, and may receive the predicted target address that was originally provided to the fetch control unit 1512. The execution core 1524 may be configured to calculate the target address from the operands of the branch op, and to compare the calculated target address to the predicted target address to detect correct prediction or misprediction. The execution core 1524 may also evaluate any other prediction made with respect to the branch op, such as a prediction of the branch op's direction. If a misprediction is detected, execution core 1524 may signal that fetch control unit 1512 should be redirected to the correct fetch target. Other units, such as the scheduler 1520, the mapper 1518, and the decode unit 1516 may flush pending ops/instructions from the speculative instruction stream that are subsequent to or dependent upon the mispredicted branch.

The execution core may include a data cache 1526, which may be a cache memory for storing data to be processed by the processor 1510. Like the instruction cache 1514, the data cache 1526 may have any suitable capacity, construction, or line size (e.g. direct mapped, set associative, fully associative, etc.). Moreover, the data cache 1526 may differ from the instruction cache 1514 in any of these details. As with instruction cache 1514, in some embodiments, data cache 1526 may be partially or entirely addressed using physical address bits. Correspondingly, a data TLB (DTLB) 1532 may be provided to cache virtual-to-physical address translations for use in accessing the data cache 1526 in a manner similar to that described above with respect to ITLB 1530. It is noted that although ITLB 1530 and DTLB 1532 may perform similar functions, in various embodiments they may be implemented differently. For example, they may store different numbers of translations and/or different translation information.

The register file 1522 may generally include any set of registers usable to store operands and results of ops executed in the processor 1510. In some embodiments, the register file 1522 may include a set of physical registers and the mapper 1518 may be configured to map the logical registers to the physical registers. The logical registers may include both architected registers specified by the instruction set architecture implemented by the processor 1510 and temporary registers that may be used as destinations of ops for temporary results (and sources of subsequent ops as well). In other embodiments, the register file 1522 may include an architected register set containing the committed state of the logical registers and a speculative register set containing speculative register state.

The interface unit 1524 may generally include the circuitry for interfacing the processor 1510 to other devices on the external interface. The external interface may include any type of interconnect (e.g. bus, packet, etc.). The external interface may be an on-chip interconnect, if the processor 1510 is integrated with one or more other components (e.g. a system on a chip configuration). The external interface may be on off-chip interconnect to external circuitry, if the processor 1510 is not integrated with other components. In various embodiments, the processor 1510 may implement any instruction set architecture.

System and Computer Accessible Storage Medium

Figure 16:
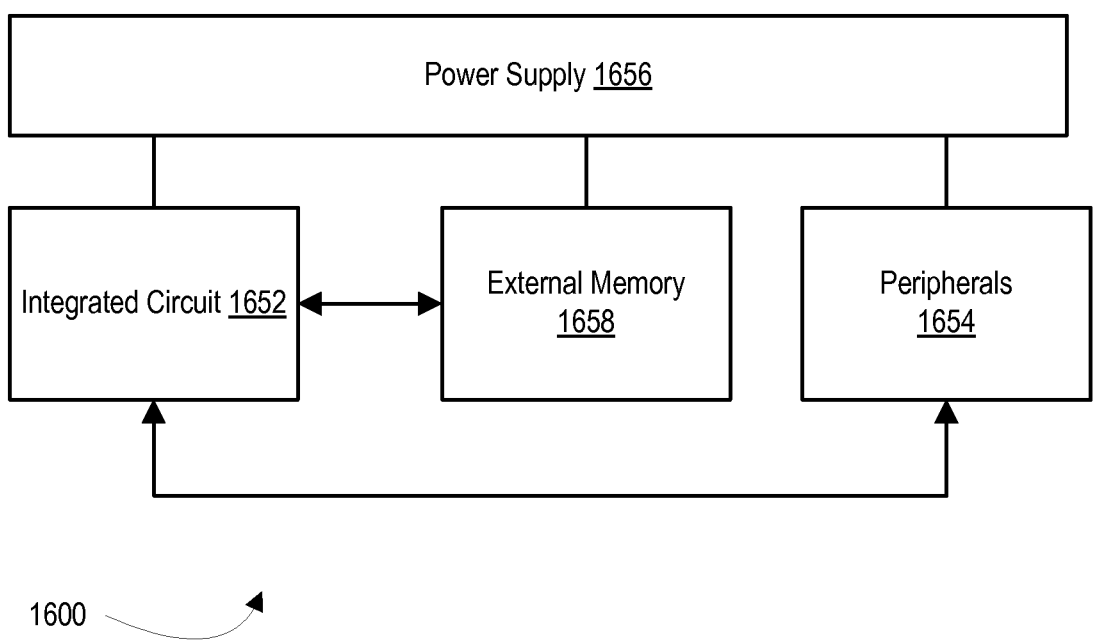
FIG. 16 illustrates an embodiment of a system that may include a processor.

Turning next to FIG. 16, a block diagram of an embodiment of a system 1600 is shown. In the illustrated embodiment, the system 1600 includes at least one instance of an integrated circuit 1652. The integrated circuit 1652 may include one or more instances of the processor 1510 (from FIG. 15). The integrated circuit 1652 may, in an embodiment, be a system on a chip including one or more instances of the processor 1510 and various other circuitry such as a memory controller, video and/or audio processing circuitry, on-chip peripherals and/or peripheral interfaces to couple to off-chip peripherals, etc. The integrated circuit 1652 is coupled to one or more peripherals 1654 and an external memory 1658. A power supply 1656 is also provided which supplies the supply voltages to the integrated circuit 1652 as well as one or more supply voltages to the memory 1658 and/or the peripherals 1654. In some embodiments, more than one instance of the integrated circuit 1652 may be included (and more than one external memory 1658 may be included as well).

The peripherals 1654 may include any desired circuitry, depending on the type of system 1600. For example, in an embodiment, the system 1600 may be a mobile device (e.g. personal digital assistant (PDA), smart phone, etc.) and the peripherals 1654 may include devices for various types of wireless communication, such as wifi, Bluetooth, cellular, global positioning system, etc. The peripherals 1654 may also include additional storage, including RAM storage, solid state storage, or disk storage. The peripherals 1654 may include user interface devices such as a display screen, including touch display screens or multitouch display screens, keyboard or other input devices, microphones, speakers, etc. In other embodiments, the system 1600 may be any type of computing system (e.g. desktop personal computer, laptop, workstation, net top etc.).

The external memory 1658 may include any type of memory. For example, the external memory 1658 may include SRAM, nonvolatile RAM (NVRAM, such as "flash" memory), and/or dynamic RAM (DRAM) such as synchronous DRAM (SDRAM), double data rate (DDR, DDR2, DDR3, etc.) SDRAM, RAMBUS DRAM, etc. The external memory 1658 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a sense amplifier coupled to receive a differentially-encoded pair of bit line signals from a column of storage cells of an array and further coupled to receive a sense amplifier enable signal that is distinct from a clock signal, wherein a valid value of the pair of bit line signals is encoded with a voltage differential across the pair of bit line signals that is smaller than a voltage difference between a true logic zero and a true logic one;
   a sense amplifier latch including a latch input, a latch output, and a latch enable signal, wherein the latch input is coupled to receive one or more data output signals from the sense amplifier, wherein during operation, in response to assertion of the latch enable signal, the sense amplifier latch opens to pass a value of the latch input to the latch output, and in response to deassertion of the latch enable signal, the sense amplifier latch closes to store the value of the latch input;
   a plurality of logic gates that, during operation, detects assertion of one or more input signals and responsively asserts the sense amplifier enable signal; and
   a self-timed loop circuit coupled to the plurality of logic gates and further coupled to receive the sense amplifier enable signal;
   wherein during operation, in response to assertion of the sense amplifier enable signal, the sense amplifier is activated to convert the voltage differential across the pair of bit line signals into the one or more data output signals encoded using voltage values corresponding to the true logic zero or the true logic one;
   wherein the latch enable signal is controlled by the sense amplifier enable signal, such that the sense amplifier latch opens in response to activation of the sense amplifier and closes in response to deactivation of the sense amplifier; and
   wherein during operation, the self-timed loop circuit detects assertion of the sense amplifier enable signal and, in response, causes the sense amplifier enable signal to deassert, such that assertion of the sense amplifier enable signal is frequency dependent and deassertion of the sense amplifier enable signal is self-timed.

2. The apparatus of claim 1, further comprising:
   a plurality of logic gates that, during operation, detects assertion of one or more input signals and responsively asserts a word line driver enable signal, wherein assertion of the word line driver enable signal controls whether a row of storage cells of the array is activated; and
   a self-timed word line kill circuit coupled to the plurality of logic gates and further coupled to receive a sense amplifier enable signal generated by the plurality of logic gates;
   wherein individual ones of the storage cells of the row correspond to respective columns of the array, the array including a respective pair of bit line signals corresponding to each column, and wherein each individual one of the storage cells of the row, when activated in response to assertion of the word line driver enable signal, outputs a stored value via a respective pair of bit line signals of a corresponding column; and
   wherein during operation, the self-timed word line kill circuit detects assertion of the sense amplifier enable signal and, in response, causes the word line driver enable signal to deassert, such that assertion of the word line driver enable signal is frequency dependent and deassertion of the word line driver enable signal is self-timed.

3. The apparatus of claim 1, further comprising a multiplexer that, during operation, selects one of a bypass input or a scan data input to generate a test data output, wherein the test data output encodes both a data value and a control value that causes the data value to be selected, wherein the sense amplifier latch is coupled to receive the test data output, and wherein in response to the control value of the test data output, the sense amplifier latch during operation overrides a stored data value with the data value encoded by the test data output, such that the sense amplifier latch outputs the data value received from the multiplexer instead of the stored data value.

4. A memory array, comprising:
   a plurality of storage cells arranged as a plurality of rows and a plurality of columns;
   a plurality of bit lines, including at least one respective bit line for each of the plurality of columns, wherein ones of the storage cells that occupy a given one of the columns are coupled to the at least one respective bit line corresponding to the given column;
   a plurality of sense amplifiers, including a respective sense amplifier for each of the plurality of columns, wherein the at least one respective bit line corresponding to the given column is coupled to the respective sense amplifier corresponding to the given column;
   a plurality of sense amplifier latches, including a respective sense amplifier latch for each of the plurality of columns, wherein a data output of the respective sense amplifier corresponding to the given column is coupled to the respective sense amplifier latch corresponding to the given column;
   a plurality of logic gates that, during operation, detects assertion of one or more input signals and responsively asserts a word line driver enable signal, wherein assertion of the word line driver enable signal controls whether a row of storage cells of the array is activated; and
   a self-timed word line kill circuit coupled to the plurality of logic gates and further coupled to receive a sense amplifier enable signal generated by the plurality of logic gates;
   wherein each of the sense amplifiers is coupled to receive a corresponding sense amplifier enable signal that is distinct from a clock signal, wherein in response to assertion of the corresponding sense amplifier enable signal, the respective sense amplifier corresponding to the given column amplifies a signal transmitted by the at least one respective bit line corresponding to the given column;

wherein each of the sense amplifier latches is coupled to receive an amplified signal output by a respective one of the sense amplifiers;

wherein in response to assertion of the corresponding sense amplifier enable signal, the respective sense amplifier latch corresponding to the given column opens to receive the amplified signal output by the respective sense amplifier corresponding to the given column;

wherein in response to deassertion of the corresponding sense amplifier enable signal, the respective sense amplifier latch corresponding to the given column closes to store the amplified signal output by the respective sense amplifier corresponding to the given column;

wherein individual ones of the storage cells of the row correspond to respective columns of the array, the array including a respective pair of bit line signals corresponding to each column, and wherein each individual one of the storage cells of the row, when activated in response to assertion of the word line driver enable signal, outputs a stored value via a respective pair of bit line signals of a corresponding column; and wherein during operation, the self-timed word line kill circuit detects assertion of the sense amplifier enable signal and, in response, causes the word line driver enable signal to deassert, such that assertion of the word line driver enable signal is frequency dependent and deassertion of the word line driver enable signal is self-timed.

5. The memory array of claim 4, wherein assertion of the sense amplifier enable signal is frequency dependent and deassertion of the sense amplifier enable signal is self-timed.

6. The memory array of claim 4, wherein for each of the plurality of columns, the at least one respective bit line comprises a respective pair of differentially-encoded bit lines.

7. The memory array of claim 4, further comprising a plurality of word lines respectively corresponding to the plurality of rows, wherein each of the word lines controls whether a corresponding one of the rows is activated, and wherein assertion of each of the word lines is frequency dependent and deassertion of each of the word lines is self-timed.

8. The memory array of claim 4, wherein the sense amplifier latches are further configured to selectively output either values received from respective sense amplifiers or test data received from a source external to the memory array.

9. An apparatus, comprising:
a sense amplifier that, during operation, is activated for evaluation in response to assertion of a sense amplifier enable signal that is distinct from a clock signal;
a sense amplifier latch coupled to receive data output from the sense amplifier and to controllably latch the data in response to a latch enable signal, wherein the latch enable signal is controlled by the sense amplifier enable signal;
a plurality of logic gates that, during operation, detects assertion of one or more input signals and responsively asserts the sense amplifier enable signal; and
a self-timed loop circuit coupled to the plurality of logic gates and further coupled to receive the sense amplifier enable signal;
wherein during operation, the self-timed loop circuit detects assertion of the sense amplifier enable signal and, in response, causes the sense amplifier enable signal to deassert, such that assertion of the sense amplifier enable signal is frequency dependent and deassertion of the sense amplifier enable signal is self-timed.

10. The apparatus of claim 9, wherein assertion of the sense amplifier enable signal is frequency dependent and deassertion of the sense amplifier enable signal is self-timed.

11. The apparatus of claim 9, wherein the sense amplifier enable signal is logically derived from one or more memory array control signals in combination with one or more clock signals.

12. The apparatus of claim 9, wherein the sense amplifier is coupled to a pair of differentially-encoded bit lines corresponding to a column of storage cells of a memory array.

13. The apparatus of claim 9, wherein the sense amplifier latch is further configured to selectively output either data output received from the sense amplifier or test data received from a source other than the sense amplifier.

14. The apparatus of claim 13, wherein the test data encodes both a data value and a control value that causes the sense amplifier latch to select the data value.

15. A method, comprising:
asserting a sense amplifier enable signal that is distinct from a clock signal;
in response to assertion of the sense amplifier enable signal, evaluating a bit line input of a sense amplifier and generating a sense amplifier output;
in response to assertion of the sense amplifier enable signal, receiving the sense amplifier output onto a storage node of the sense amplifier latch;
detecting, in a self-timed loop circuit, assertion of the sense amplifier enable signal, and in response to said assertion, causing the sense amplifier to be deasserted by the self-timed loop circuit, such that assertion of the sense amplifier enable signal is frequency dependent and deassertion of the sense amplifier enable signal is self-timed;
in response to deassertion of the sense amplifier enable signal, retaining a value of the storage node such that further changes in the sense amplifier output do not affect the value of the storage node while the sense amplifier enable signal is deasserted.

16. The method of claim 15, further comprising:
evaluating a test data input that encodes a control value indicative of whether a data value encoded in the test data input should be selected; and
in response to determining that the control value indicates that the data value should be selected, outputting the data value from the sense amplifier latch instead of the value of the storage node.

17. The method of claim 15, wherein the bit line input comprises a pair of differentially-encoded bit lines corresponding to a column of storage cells of a memory array.

18. A microprocessor, comprising:
an instruction execution core that, during operation, executes instructions; and
one or more memory arrays that, during operation, store instructions, data operated on during execution of instructions, or state information used during execution of instructions;
wherein the one or more memory arrays comprise:
a sense amplifier that, during operation, generates a sense amplifier output dependent upon a bit line input in response to assertion of a sense amplifier enable signal that is distinct from a clock signal;
a sense amplifier latch that, during operation, receives the sense amplifier output onto a storage node of the sense amplifier latch in response to assertion of the sense amplifier enable signal;
a plurality of logic gates that, during operation, detects assertion of one or more input signals and responsively asserts the sense amplifier enable signal; and a self-timed loop circuit coupled to the plurality of logic gates and further coupled to receive the sense amplifier enable signal;

wherein the sense amplifier latch, during operation and in response to deassertion of the sense amplifier enable signal, further retains a value of the storage node such that further changes in the sense amplifier output do not affect the value of the storage node while the sense amplifier enable signal is deasserted; and wherein during operation, the self-timed loop circuit detects assertion of the sense amplifier enable signal and, in response, causes the sense amplifier enable signal to deassert, such that assertion of the sense amplifier enable signal is frequency dependent and deassertion of the sense amplifier enable signal is self-timed.

19. The microprocessor of claim 18, wherein assertion of the sense amplifier enable signal is frequency dependent and deassertion of the sense amplifier enable signal is self-timed.

* * * * *